(12) United States Patent
McElvain et al.

(10) Patent No.: US 6,711,729 B1
(45) Date of Patent: Mar. 23, 2004

(54) METHODS AND APPARATUSES FOR DESIGNING INTEGRATED CIRCUITS USING AUTOMATIC REALLOCATION TECHNIQUES

(75) Inventors: Kenneth S. McElvain, Los Altos, CA (US); Smita Bakshi, Los Gatos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 171 days.

(21) Appl. No.: 09/730,990

(22) Filed: Dec. 5, 2000

(51) Int. Cl.[7] .............................. G06F 17/50; G06F 9/45
(52) U.S. Cl. ................................. 716/18; 716/2; 716/7
(58) Field of Search .................................. 716/18, 2, 7

(56) References Cited

U.S. PATENT DOCUMENTS

| | | | | |
|---|---|---|---|---|
| 5,812,417 A | * | 9/1998 | Young ............................ | 716/9 |
| 5,841,663 A | * | 11/1998 | Sharma et al. ................. | 716/18 |
| 6,145,117 A | * | 11/2000 | Eng ............................... | 716/18 |
| 6,170,080 B1 | * | 1/2001 | Ginetti et al. .................. | 716/18 |
| 6,189,131 B1 | * | 2/2001 | Graef et al. .................... | 716/8 |
| 6,360,356 B1 | * | 3/2002 | Eng ............................... | 716/18 |
| 6,421,818 B1 | * | 7/2002 | Dupenloup et al. ............ | 716/18 |
| 6,438,735 B1 | * | 8/2002 | McElvain et al. .............. | 716/7 |

* cited by examiner

Primary Examiner—A. M. Thompson
(74) Attorney, Agent, or Firm—Blakely, Sokoloff, Taylor & Zafman LLP

(57) ABSTRACT

Methods and apparatuses for designing an integrated circuit (IC). In one exemplary method, a hardware description language (HDL) code is compiled to produce a representation of logic, and a portion of this representation of logic is allocated to a first physical portion of an area of the IC. This portion is reallocated automatically, according to machine determined parameters, such that a modified portion of the representation is allocated to the first physical portion. Examples of this reallocating include moving logic between regions on the IC, replicating logic based on the regions of the IC, decomposing RTL instances into elements based on information concerning the regions, reducing logic path crossings of a region's boundaries, and assuring that the original allocation or the result of a reallocation can be accommodated by the first physical portion of the IC.

80 Claims, 18 Drawing Sheets

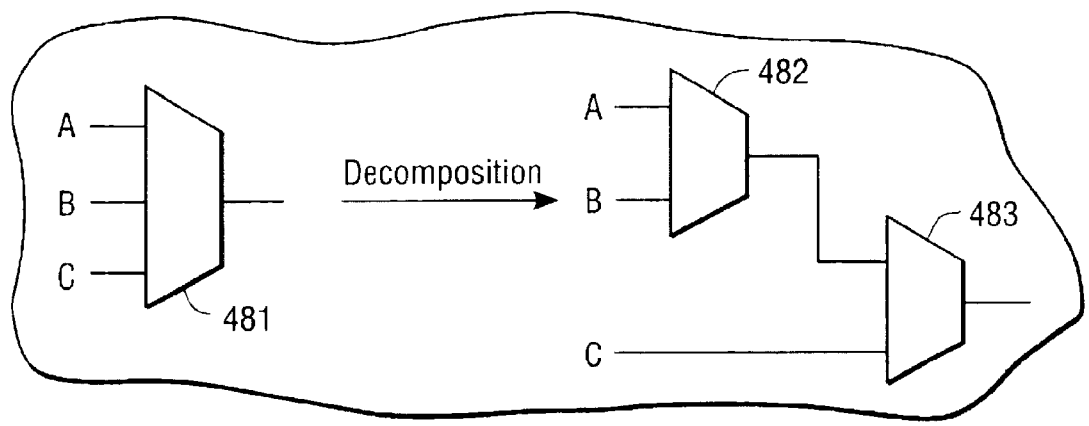
FIG. 12A (PRIOR ART)
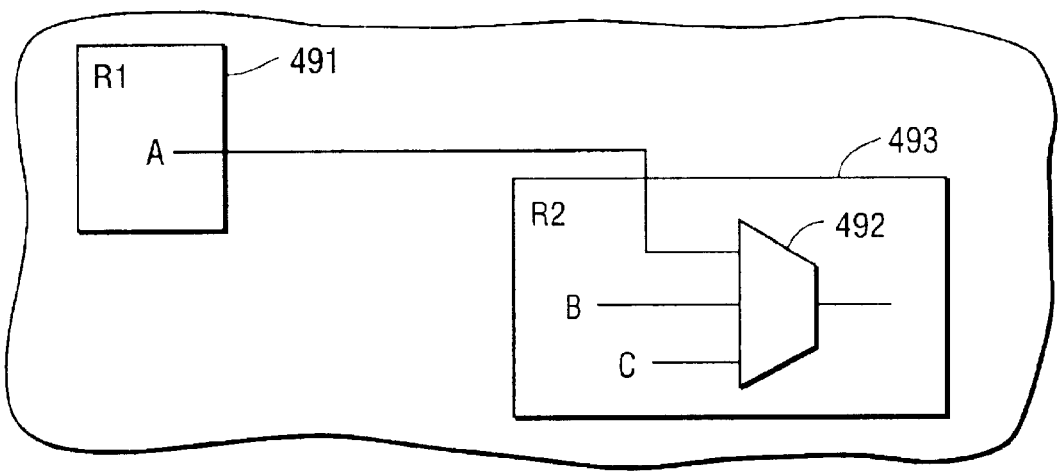
FIG. 12B
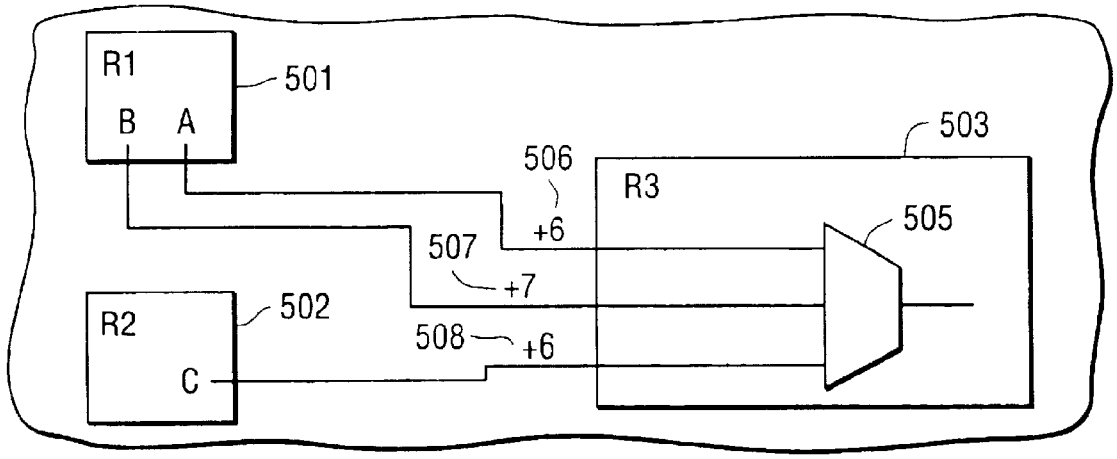
FIG. 12C1

FIG. 12C2

For each register to register path starting in a first region ("R1") and ending in a 2nd region ("R2") (where R1 and R2 could be the same), determine all sequences of instances on the path that are contained in regions other than R1 or R2 — 621

Determine the effect on timing parameters (e.g., input and output slacks at clocked registers) which would be caused by moving the sequence to either R1 or R2; if the timing parameters are improved, then move the sequence to either R1 or R2 (depending on which has better timing parameters after the proposed move) unless the sequence is driving loads in the other regions (in which case the sequence is replicated and the copy is moved to R1 or R2) — 623

METHODS AND APPARATUSES FOR DESIGNING INTEGRATED CIRCUITS USING AUTOMATIC REALLOCATION TECHNIQUES

FIELD OF THE INVENTION

The present invention relates generally to the field of designing integrated circuits, and more particularly to the design of integrated circuits through a synthesis process which begins with the use of a hardware description language.

BACKGROUND OF THE INVENTION

For the design of digital circuits on the scale of VLSI (very large scale integration) technology, designers often employ computer aided techniques. Standard languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technology/architecture to implement logic circuits within their integrated circuits. Thus, the technology independent RTL netlist is mapped to create a netlist which is specific to a particular vendor's technology/architecture.

One operation which is often desirable in this process is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

FIG. 1 illustrates a method in the prior art for performing floorplanning and designing an integrated circuit (IC). In operation 10, a logic design, in an HDL code is submitted to an HDL compiler and is compiled. In operation 12, the compiled HDL description produces a technology independent RTL netlist which may be graphically displayed to a designer. FIG. 2A shows an example of a display 51 which includes a display of the surface area 53 of an IC and which also includes a graphical display of an RTL netlist having two modules M1 and M2 which have been labeled as modules 57 and 59. Within each of these modules there is certain logic, such as clocked registers 60 and 66 as well as logic 61, 62 and 65, and an adder 63 and a multiplexer 64.

Referring back to FIG. 1, a human designer of the IC may select in operation 14 a portion of the RTL netlist and assign/allocate this portion to a designated, specific portion of an area of the IC. Referring back to FIG. 2A, for example, a designer may select certain portions of the RTL netlist graphically shown in the display 51 and assign these portions to the region R1, labeled as 55 on the surface of the IC graphically represented as surface or region 53 in FIG. 2A. The designer may perform this selection by a number of different techniques including a graphical user interface technique which allows a dragging and dropping of logic from the graphically displayed RTL netlist to the region 55. In the example shown in FIG. 2B, the user has selected and allocated the clock registers 60 and 66 as well as logic 65 and the multiplexer 64 and the adder 63 to the region R1, thereby creating a third module 73. Module M1, now labeled as 71 in FIG. 2B, still includes logic L1 and L2 while module 72 currently contains no logic as shown in FIG. 2B. The system, in response to this selection operation 14 in FIG. 1, will change the hierarchy of the RTL objects within each of the modules so that these objects are tagged with an identifier indicating the new modules to which they are assigned and the regions to which they are assigned. Referring back to FIG. 1, in operation 16, the system will map the RTL netlist after the allocation to a target architecture to generate a technology specific netlist. Then in operation 18, place and route tools, such as conventional software tools, are used to process the technology specific netlist to generate the necessary data which will be used to program or create circuitry on an IC based on the technology specific netlist.

The method of FIG. 1 does allow a human designer greater control over the final design by allowing the designer to assign or allocate portions of the design to designated regions of the IC. After this allocation, prior art systems treat these allocations as "hard" constraints and such prior art systems do not attempt to reallocate assigned or allocated logic back into other regions of the IC. While this approach provides flexibility and control to the designer, it may also trap the design in a low performance state than could be otherwise achievable by reallocating logic after the user has allocated or specified an allocation.

SUMMARY OF THE INVENTION

Methods and apparatuses for designing an integrated circuit are described. In one exemplary method, a hardware description language code is compiled to produce a representation of logic, and a portion of this representation of logic is allocated to a first physical portion of an area of the integrated circuit. This portion is reallocated automatically, according to machine determined parameters, such that a modified portion of the representation is allocated to the first physical portion. Examples of this reallocating include moving logic between regions on the integrated circuit, replicating logic based on the regions of the integrated circuit, decomposing RTL instances into elements based on information concerning the regions, reducing logic path crossings of a region's boundaries, and assuring that the result of the reallocation can be accommodated by the first physical portion of the integrated circuit.

Digital processing systems which are capable of performing methods of the present invention are also described. Machine readable media are described which, when executed on a digital processing system, such as a computer system, causes the system to design an integrated circuit according to at least one of the methods described herein.

BRIEF DESCRIPTION OF THE DRAWINGS

The present invention is illustrated by way of example and not by way of limitation in the figures of the accompanying drawings in which like references indicate similar elements.

FIG. 12A shows an example in the prior art for decomposing an RTL instance into elements.

FIG. 12B shows the relationship between an RTL instance and the origins of the inputs to that instance.

FIG. 12C1 shows an example of an RTL instance and the origin of its inputs along with timing parameters associated with those inputs.

FIG. 12C2 shows the result of a decomposition of an RTL instance without taking into account the origin of the inputs to the RTL instance.

FIG. 13C shows an exemplary method for performing the reallocation shown in FIG. 13B.

DETAILED DESCRIPTION

Methods and apparatuses for designing an integrated circuit are described herein. In the following description, for purposes of explanation, numerous specific details are set forth in order to provide a thorough understanding of the present invention. It will be evident, however, to one skilled in the art that the present invention may be practiced without these specific details. In other instances, well known structure, processes and devices are shown in block diagram form or are referred to in summary manner in order to provide an explanation without undue detail.

Figure 2A:
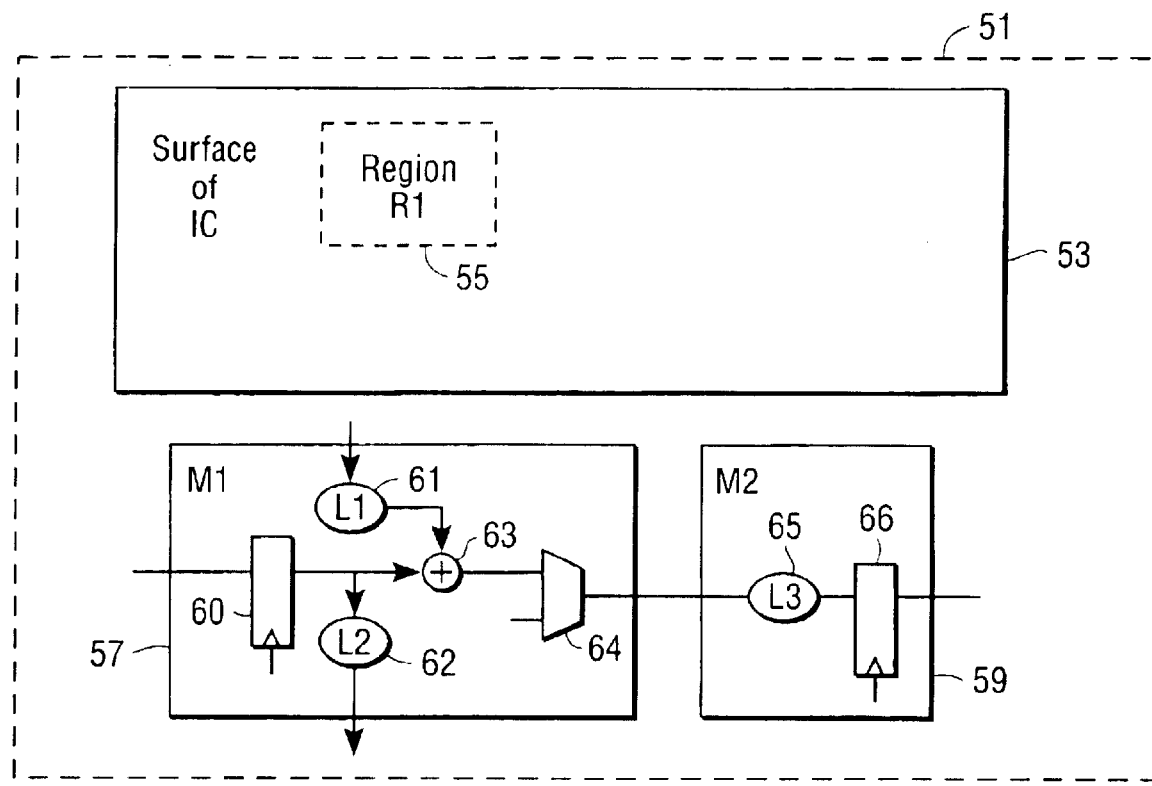
FIG. 2A shows a representation of a display device of a system which may be used to design integrated circuits, such as a computer system.
Figure 3:
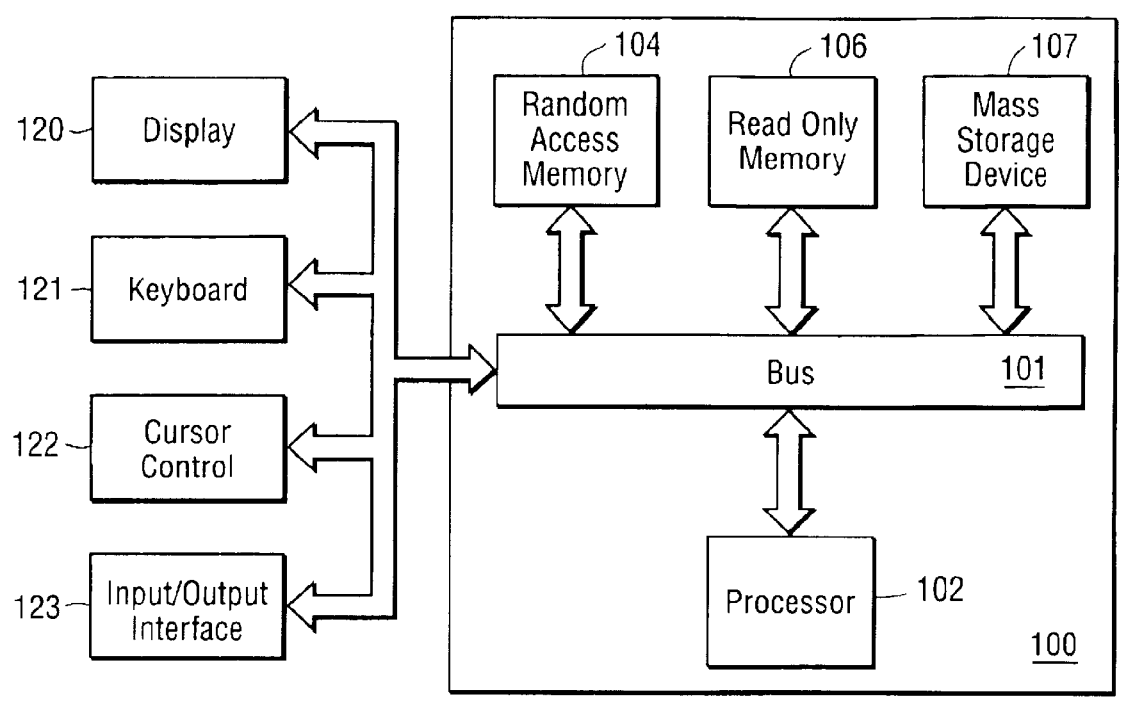
FIG. 3 is a block diagram of an exemplary digital processing system that may be used to implement various embodiments of the present invention.

Many of the methods of the present invention may be performed with a digital processing system, such as a conventional, general purpose computer system. Special purpose computers which are designed or programmed to perform only one function may also be used. FIG. 3 illustrates a block diagram of a computer system that may be used to implement embodiments of the present invention. The computer system is used to perform synthesis of a design that is described in an HDL code. The computer system includes a processor 102 which is coupled through a bus 101 to a random access memory 104 and a read-only memory 106 and a mass storage device 107. Mass storage device 107 represents a persistent data storage device such as a floppy disk drive, a fixed disk drive (e.g. a magnetic drive, an optical drive, or the like) which may be local or remote. Processor 102 may be embodied in a general purpose processor (such as the Intel Pentium processors), a special purpose processor or a specially programmed logic device. Display 120 is coupled to the processor 102 through the bus 101 and provides graphical output for the computer system. This graphical output is typically a graphical user interface which will be used to control the operation of the computer system. Further, this display may show all or portions of the logic in a compiled design and display this logic relative to a display of an IC's area in order to provide floorplanning of the IC. FIG. 2A shows an example of a display 51 with an exemplary graphical user interface which may be used to create floorplans on an IC.

Keyboard 121 and cursor control device 122 (e.g. a mouse) are coupled to the bus 101 for communicating information and command selections to the processor 102. Also coupled to the processor 102 through bus 101 is an input/output interface 123 which can be used to control and transfer data to and from electrical devices such as printers and other computers which are coupled to the computer system 100.

It should be noted that the architecture of FIG. 3 is provided for purposes of illustration only and that a computer system or other digital processing system used in conjunction with the present invention is not limited to this specific architecture.

Figure 4:
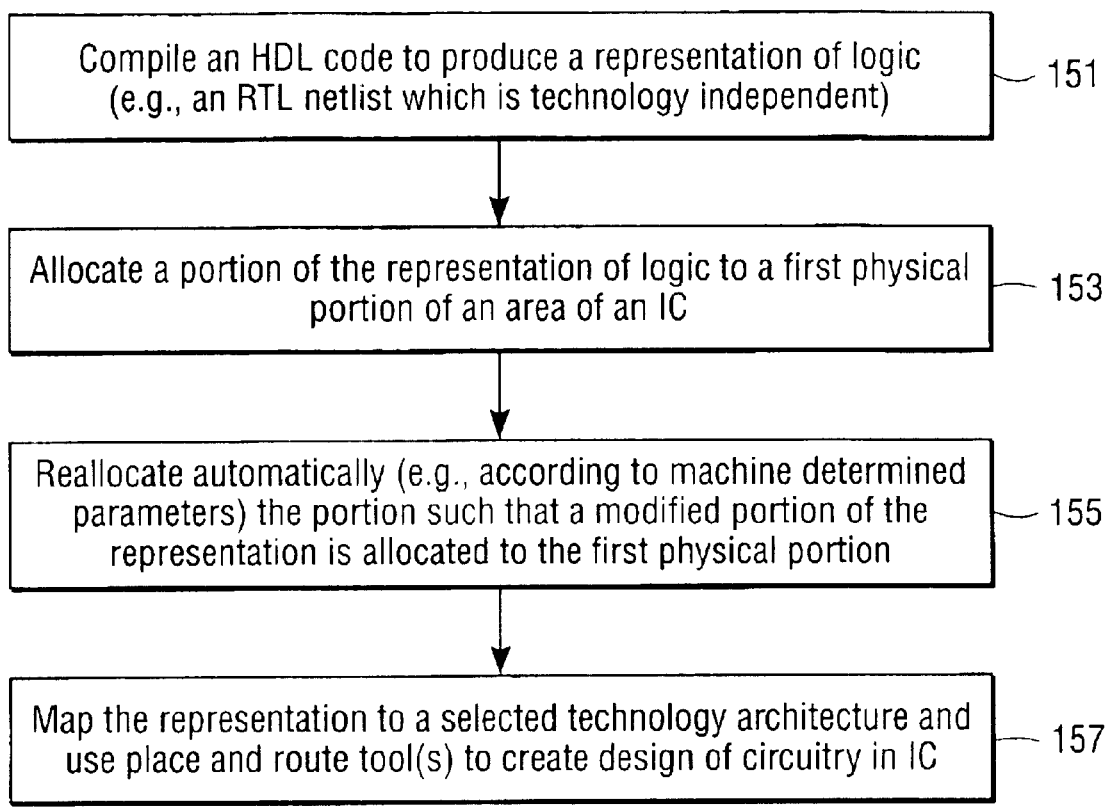
FIG. 4 is a flowchart illustrating one generalized exemplary method allowing for the automatic reallocation of logic.

A general example of certain embodiments in which logic is automatically reallocated will now be provided while referring to FIG. 4. While most embodiments of the present invention are intended for use in an HDL design synthesis software, the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention will be described in the context of use in HDL synthesis systems, and particularly those designed for use with integrated circuits which have vendor-specific technology/architectures. As is well known, the target architecture is typically determined by a supplier of programmable ICs. An example of a target architecture is the programmable lookup tables (LUTs) and associated logic of the integrated circuits which are field programmable gate arrays from xilinx, Inc. of San Jose, Calif. Other examples of target architecture/technology include those well known architectures in field programmable gate arrays and complex programmable logic devices from vendors such as Altera, Lucent Technology, Advanced Micro Devices, and Lattice Semiconductor. For certain embodiments, the present invention may also be employed with application specific integrated circuits (ASICs).

The method shown in FIG. 4 begins in operation 151 in which an HDL code is compiled to produce a representation of logic. In one exemplary embodiment, this representation of logic is an RTL netlist which is technology independent. In operation 153, a portion of this representation of logic is allocated to a first physical portion of an area of the integrated circuit. This typically occurs by the human designer deciding to select certain RTL instances or other representations of the logic and assigning these to a specific region. Again, referring to FIG. 2A, the user may select certain objects in the representation of logic and drag and drop them onto representations of physical regions of the IC, such as region 55 of the IC 53 shown in the display 51 of FIG. 2A. In operation 155, the system automatically reallocates, according to machine determined parameters, the portion allocated in operation 153 such that a modified portion of the representation is allocated to the first physical portion. Various different types of reallocation and methods for performing reallocations are further described below. These include tunneling/moving, replicating, decomposing, reducing region crossings, and fitting of the modified portion to a particular region. After operation 155, the system typically maps, in operation 157, the representation to a selected technology architecture and uses place and route tools to create a design of circuitry in the integrated circuit. The foregoing example of FIG. 4 shows one particular order of the operations. It will, however, be appreciated that alternative orders may be practiced in accordance with the invention. For example, operation 155 or portions of operation 155 may occur during operation 157, or operation 155 or portions of operation 155 may occur after operation 157. It will be appreciated that in certain embodiments, the system may merely output a netlist appropriate for use in the selected technology architecture which can then be used with available place and route tools to create the design of the integrated circuit. For example, conventional place and route software tools that are used to create a design of circuitry and a target architecture, such as a xilinx or Altera FPGA may be used to process the outputted netlist to create the circuitry in an integrated circuit.

Figure 2B:
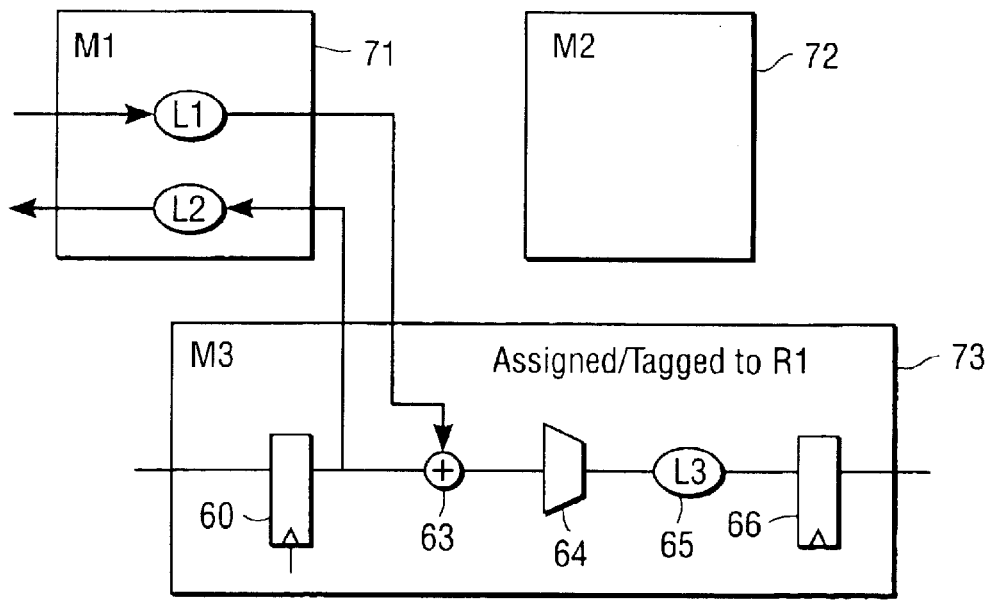
FIG. 2B shows representations of modules containing logic after an allocation of logic using a floorplanning technique.
Figure 5A:
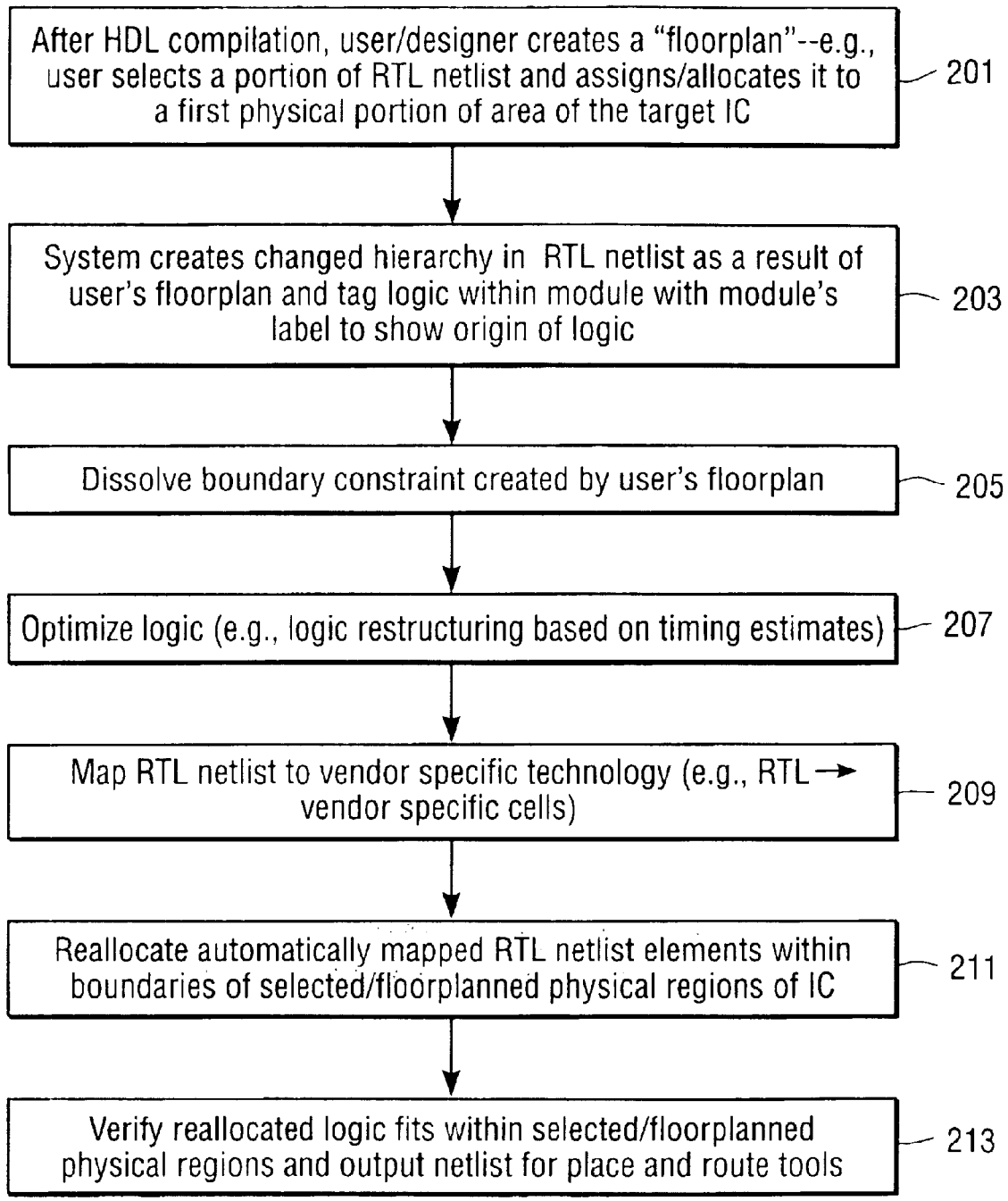
FIG. 5A is a flowchart showing a more particular example of a method of the present invention in which reallocation of logic is performed automatically.

FIG. 5A shows a more specific example of a method for designing an integrated circuit in which a reallocation of logic is performed automatically. Operation 201 begins after the compilation of the HDL code which was used to describe particular logic desired by the designer of the integrated circuit. After this compilation, the designer creates a floorplan. This may be done by selecting a portion of an RTL netlist and assigning that portion to a particular physical portion of an area of the target integrated circuit. In one alternative embodiment, the computer system, rather than the human user, may create automatically the floorplan in operation 201. The system, in response to this floorplan, creates in operation 203 a changed hierarchy in the RTL netlist. Logic within a module is tagged with a module's label to show the origin of the logic. An example of a representation of this hierarchy is shown in FIG. 2B in which a new module 73 is created with specific logic which has been assigned to it, where the logic is tagged to show that it has been assigned to region R1 and that it has originated from certain modules, such as modules 57 and 59. Then in operation 205 the boundary constraint, which was created by the user's floorplan, is dissolved in the sense that the constraint will not prevent the reallocation of logic assigned to a particular region as a result of the floorplan in operation 201. Following 205, logic is optimized in certain ways in operation 207. One optimization may include logic restructuring based on timing estimates of the logic. These optimizations may be conventional optimizations. Then in operation 209, the RTL netlist is mapped to a vendor-specific technology. For example, this RTL netlist is mapped to vendor-specific cells which are used in the specific vendor's architecture. Then in operation 211, the system automatically reallocates the mapped RTL netlist elements within boundaries of selected/floorplanned physical areas of the IC. This reallocation typically occurs based upon machine determined parameters, such as timing parameters or the location of inputs as discussed further below. Then in operation 213, the system verifies that the reallocated logic will fit within the selected/floorplanned physical regions and, if they do, then the system can output a netlist for use with the place and route software tools.

The foregoing description of the method in FIG. 5A assumes a particular process flow in which certain operations or actions follow other operations or actions. It will be appreciated that alternative flows may also be practiced with the present invention. For example, certain optimization processes may be performed after reallocation or after mapping an RTL netlist to a vendor-specific technology. In certain embodiments, the mapping of an RTL netlist to a vendor-specific technology may be performed after automatically reallocating logic within floorplanned physical regions. Other alternative sequences of operations may be envisioned by those skilled in the art.

Figure 5B:
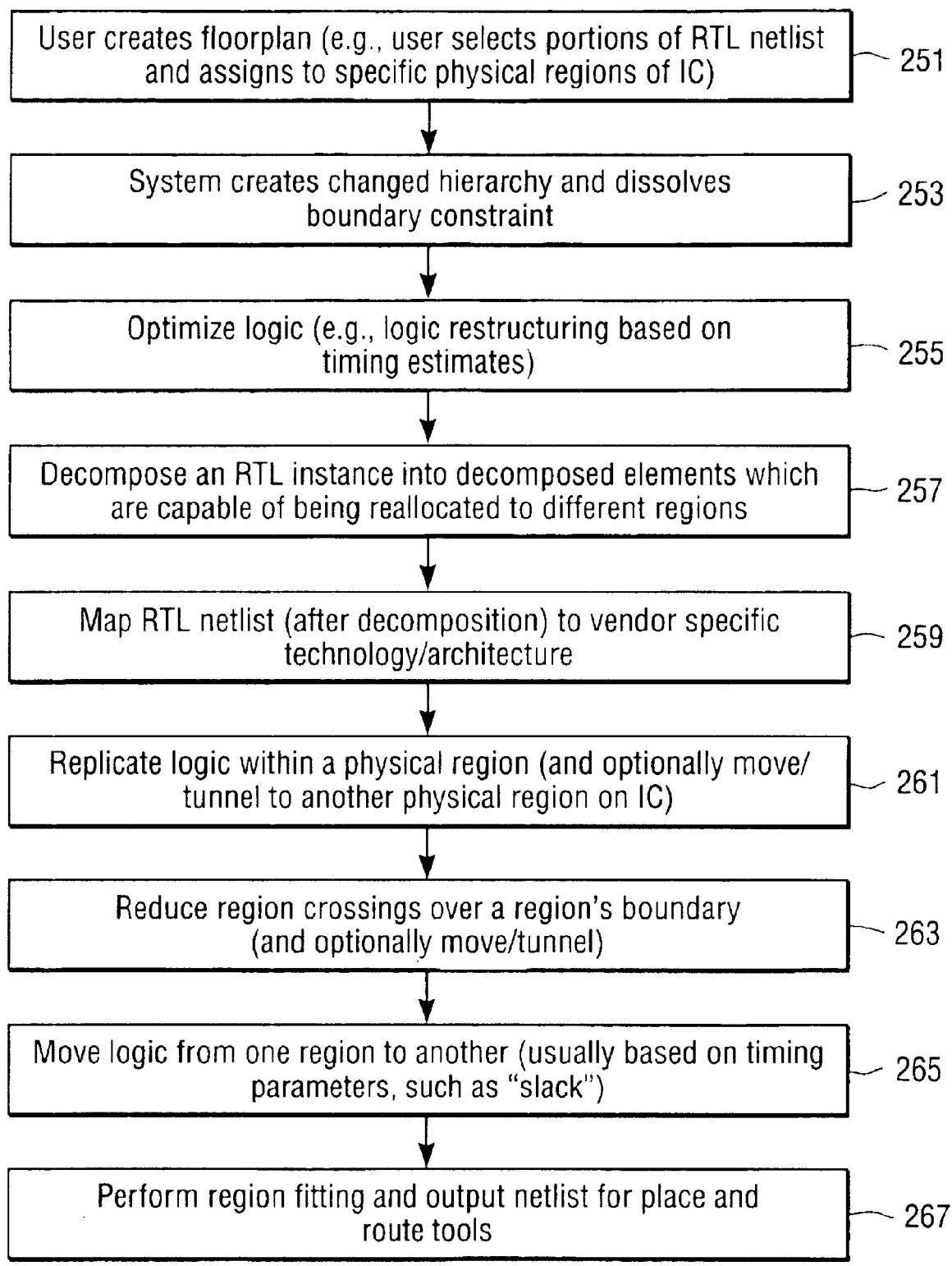
FIG. 5B is another example of a method for reallocating automatically logic according to certain methods described herein.

FIG. 5B shows one specific example of various reallocation methods in a specific order. Again, it will be appreciated that this order is provided merely for purposes of explanation and that alternative orders may also be employed with the various methods and apparatuses of the present invention. The method of FIG. 5B begins with operation 251 in which a user creates a floorplan. This operation will typically follow a compilation of HDL code to generate an RTL netlist. However, the present invention is not so limited to this specific example in which the representation of logic, such as the RTL netlist, is generated by compiling HDL code. In operation 253, the system creates a changed hierarchy, such as shown by the representations of the modules shown in FIG. 2B, and dissolves the boundary constraint created by the user in operation 251. It can be seen that operation 253 is similar to operations 203 and 205 of FIG. 5A. Referring back to FIG. 5B, operation 255 optionally involves the optimization of logic, such as the restructuring of logic based on timing estimates. Then operation 257 involves the system decomposing each RTL instance which requires decomposition into decomposed elements which are capable of being reallocated to different regions. This is unlike the prior art, in which decomposed elements which originated from an RTL instance which had been assigned to a specific region on an integrated circuit are incapable of being reallocated to a different region. Then in opeation 259, the RTL netlist or other representation of logic is mapped to a vendor-specific technology/architecture. Following this mapping operation, logic is replicated in operation 261 within a physical region. This may optionally include moving/tunneling the logic to another physical region on the integrated circuit as will be further described below. Then in operation 263, region crossings over a region's boundary are reduced and this may also include optional moving/tunneling of logic into or out of a region in order to reduce region crossings. This is also described further below. Operation 265 moves logic from one region to another region, usually based on timing parameters such as a slack parameter which is further described below. And in operation 267, a region fitting operation is performed to verify that the reallocated logic within each region may be accommodated by the resources in that physical region of the integrated circuit. If the resources of each region can accommodate the reallocated logic, then an output netlist may be generated for use with the conventional place and route software tools.

Figure 6A:
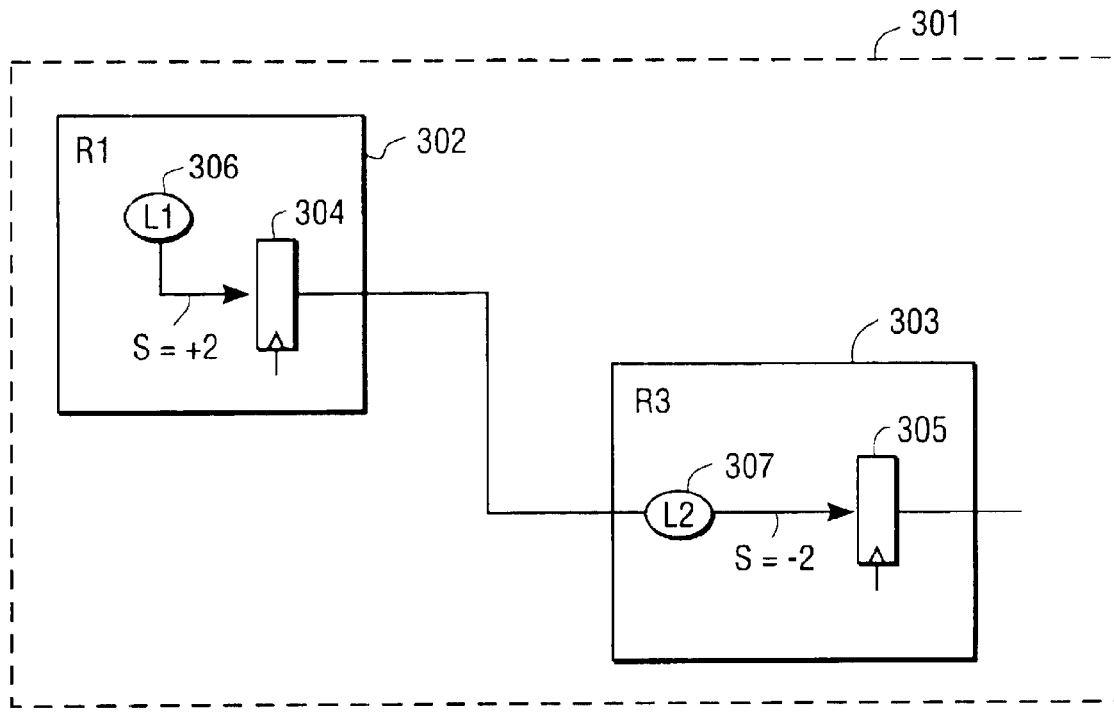
FIG. 6A shows a block diagram of two physical regions of an IC after logic has been assigned or allocated to these regions.

FIGS. 6A, 6B, 7, and 8 show various examples involving moving or tunneling of logic between regions, which is one form of reallocation. Tunneling is a method by which logic is moved between regions, typically in order to improve the performance of the design, or the area utilization, or both. Wires between regions often represent significant delays, and moving logic and registers from one region to another can change the total wire length of the path, and thereby its delay. It is also possible to automatically create intermediate regions partway between the source and destination regions to balance the wire delays. Typically, an IC designer has specified a delay constraint between registers in the integrated circuit. IC design software is typically capable of analyzing (e.g. estimating) the delay between registers, particularly after a user has allocated one portion of logic to one region of the IC and another portion of logic to another portion of the IC. The delay constraint is used to calculate slack which is typically the difference between what is desired (e.g. a user desires the propagation delay between registers to be 10 nanoseconds (ns) or less—that is, the delay constraint is 10 ns or less) and what is estimated (e.g. 8 nanoseconds may be an estimated delay time at register 304 shown in FIG. 6A, in which case the slack is a +2 nanoseconds as shown in FIG. 6A). Similarly, the propagation delay is 12 nanoseconds at register 305, in which case the slack input or input slack value for this register 305 of FIG. 6A is −2 nanoseconds, meaning that the signal is two nanoseconds late, or later, than is desired. Referring again to FIG. 6A, the area 301 represents the entire area of the IC, and regions 302 and 303 and the corresponding logic within these regions are floorplanned regions in which logic was assigned to each of these regions by the user. Thus, the design shown in FIG. 6A represents a user floorplan where the user has allocated two different portions of logic to two different designated regions 302 and 303. As shown in FIG. 6A, the user selected logic 603 and clocked register 604 for assignment or allocation to region 302, and the user also selected logic 307 and clocked register 305 to region 303. Prior art systems after this allocation would not attempt to reallocate logic from one region to another. It is noted that the portion of a design that has not been assigned to any region is automatically assigned, in one embodiment, to a region that consists of the entire chip; that is, the entire physical area of the integrated circuit.

Figure 6B:
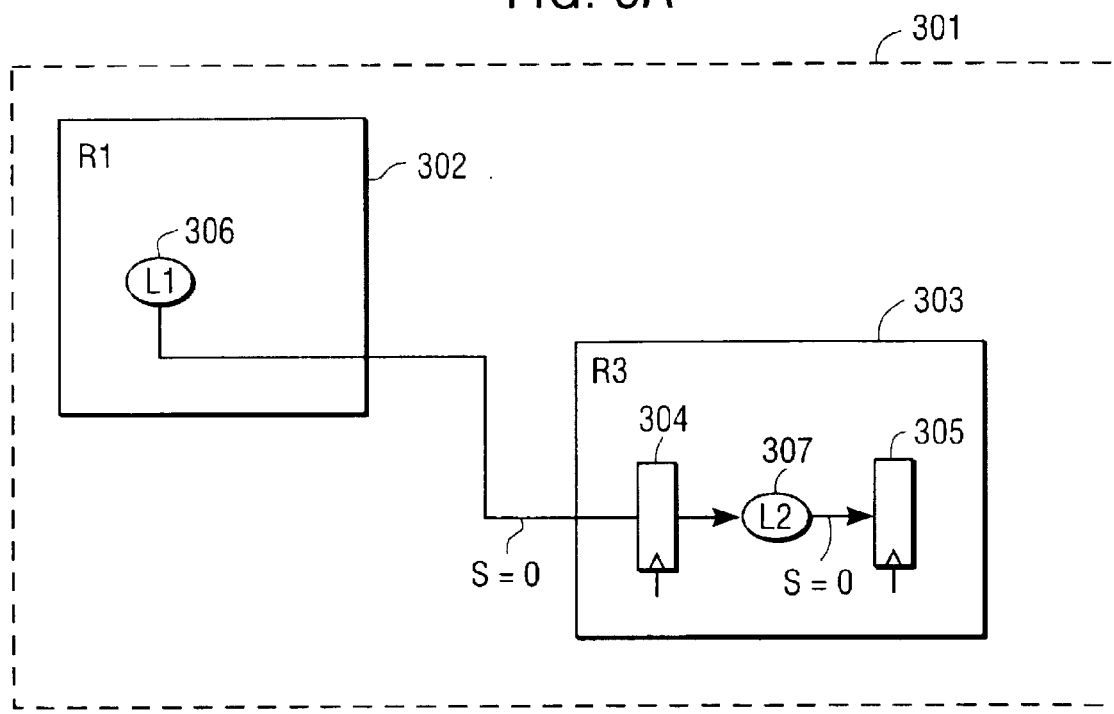
FIG. 6B shows a block diagram of logic within two regions of an IC after an automatic reallocation of logic according to one method of the present invention.

Using a tunneling method, which is one aspect of the present invention, the design may have the logic reallocated in the two regions 302 and 303 as shown in FIG. 6B. The result improves the timing parameter, referred to as the slack parameter, such that both input slacks to registers 304 and 305 now have an acceptable value of 0 nanoseconds. This occurred by moving the register 304 from the region 301 and into the region 303. It can be seen that the effective early arrival of the signal at the input of the register 304 is used to compensate for the wiring propagation delay in transmitting the signal from the region 302 to the region 303, and thus now the slack has an improved value for both registers 304 and 305. It is noted that, while the example of the movement of the register is used here, other logic may also be moved in order to improve the timing parameters, such as the slack parameter.

Figure 8:
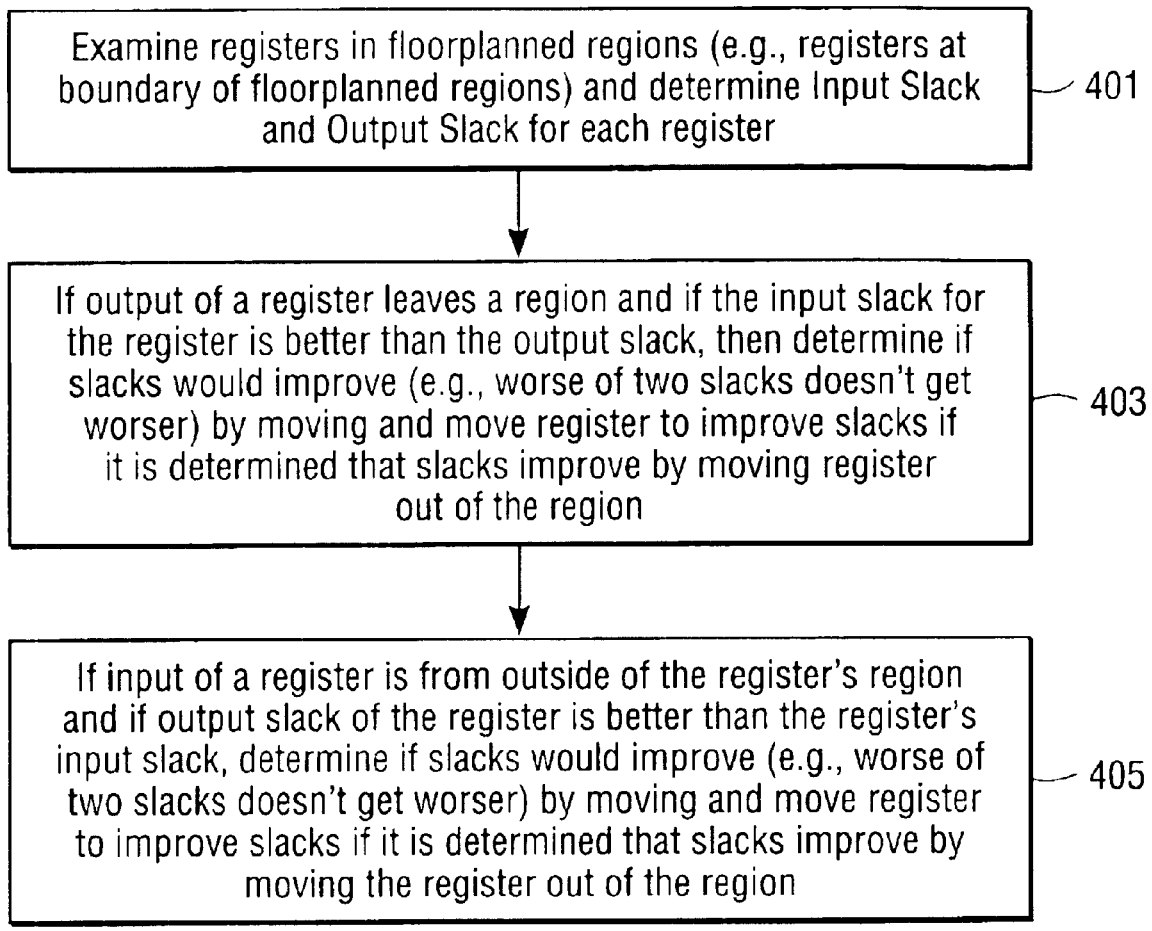
FIG. 8 is a flowchart illustrating one exemplary method for performing a type of reallocation described herein.

FIG. 8 shows a method, in one exemplary embodiment, in which registers are moved between regions. This method may be used to create the result shown in FIG. 6B from the original allocation shown in FIG. 6A. In operation 401, the registers in floorplanned regions such as regions 302 and 303 are examined. Typically, the registers at the boundary of the floorplan regions may be examined and the input and output slack values for each register may be determined as part of this examination. As shown in operation 403, if the output of a register leaves a region and if an input slack of the register, such as the slack at the input of register 304, is better than the output slack of the register, such as the slack S=−2 at the output of register 304, then it is determined if the slacks would improve by moving a register out of the region. This improvement occurs when the worst of two slacks does not get worse. If the slacks do improve by moving, then typically the output register from one region is moved to another region as shown in FIG. 6B. Operation 405 involves the case of an input register to a region where the input to the register in a region is from outside of the region. In this case, if the output slack of the register is better than the input slack, it is determined if the slacks of the register would improve (e.g. worse slack does not worsen) by moving the register out of the region (e.g. and into the region containing the source of the input) and if the slacks improve then the register is moved.

Figure 7:
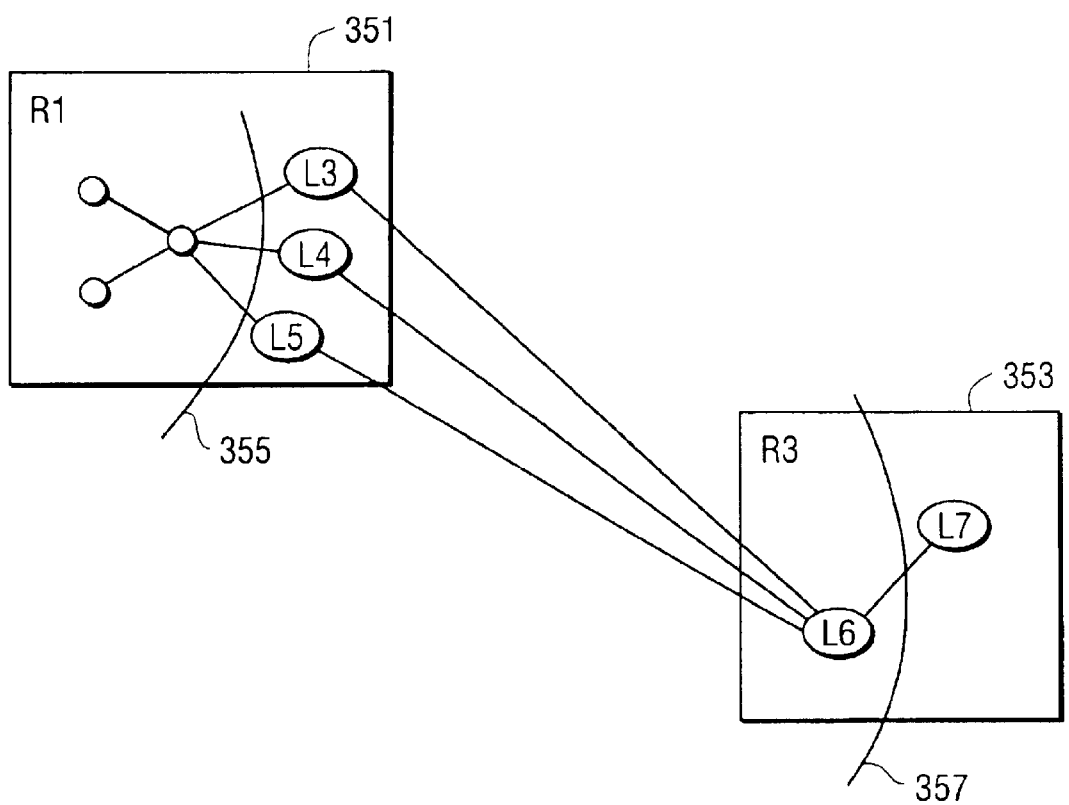
FIG. 7 shows an exemplary alternative method for performing a type of reallocation described herein.

FIG. 7 shows another technique for moving or tunneling of logic from one region to another. This technique utilizes cuts such as cut 355 shown in FIG. 7 or cut 357 shown in FIG. 7. FIG. 7 depicts two floorplanned regions 351 and 353, each containing logic which has been assigned by a user to those regions. According to this exemplary method, a list of critical nets between pairs of regions is collected. The system then determines whether an alternate cut in either of the two regions may yield a better slack value. Whichever cut yields a better slack value is used to tunnel logic from one region to another, such that the cut line now lies at the boundary of the two regions. As an example shown in FIG.

7, if the cut 355 provides a better slack value, then logic L3, L4, and L5 will be moved to region 353. On the other hand, if cut 357 yields a better slack value, then logic L6 will be moved from region 353 and into region 351.

Figure 9:
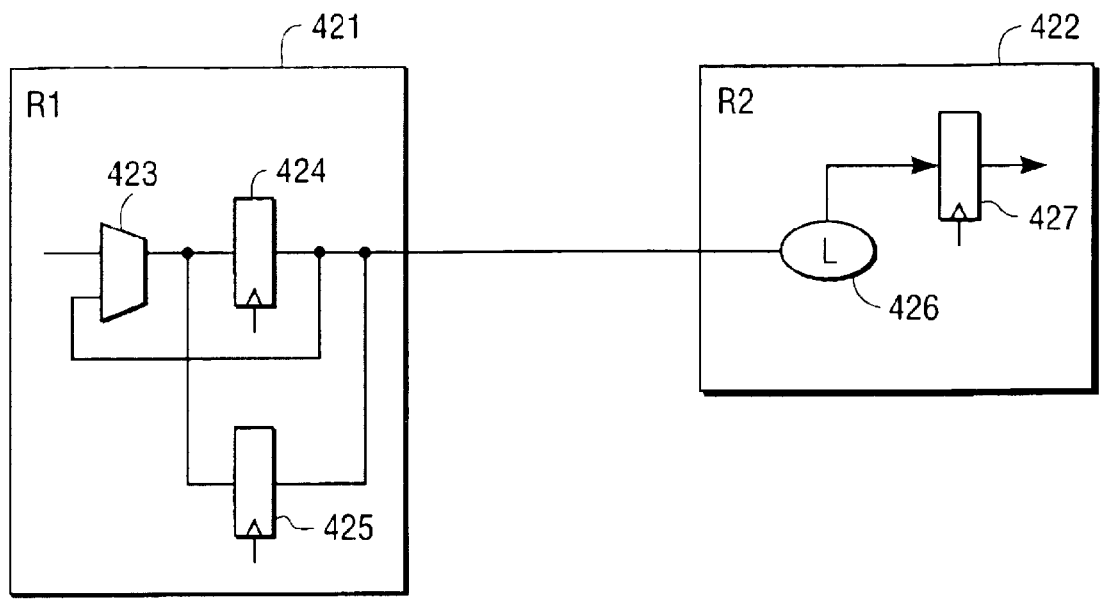
FIG. 9 shows a representation of logic within two physical regions of an IC before an automatic reallocation.
Figure 10:
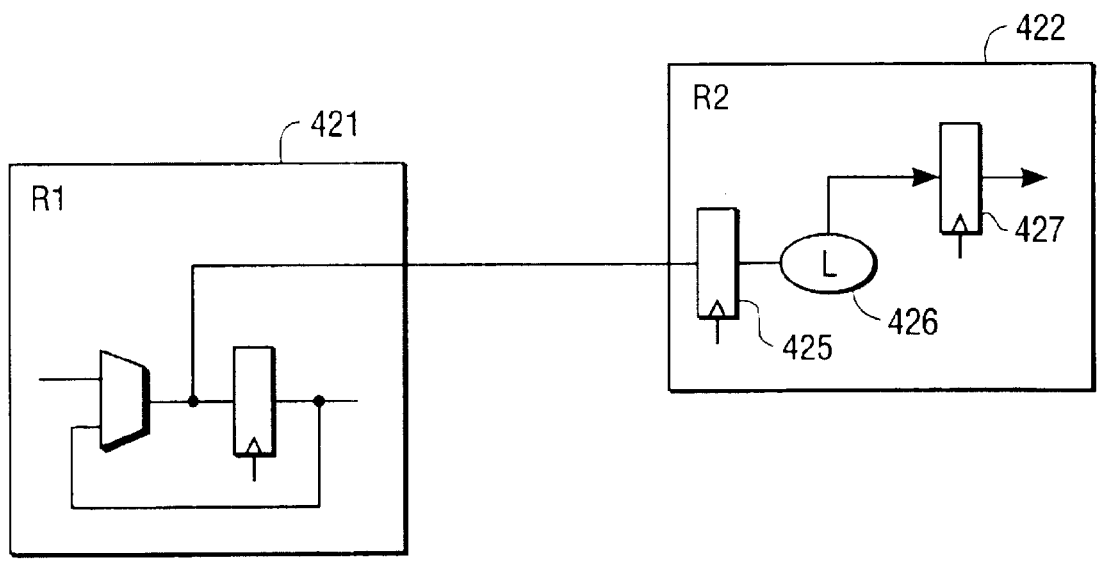
FIG. 10 shows the same regions as FIG. 9 after an automatic reallocation according to one type of reallocation described herein.
Figure 11:
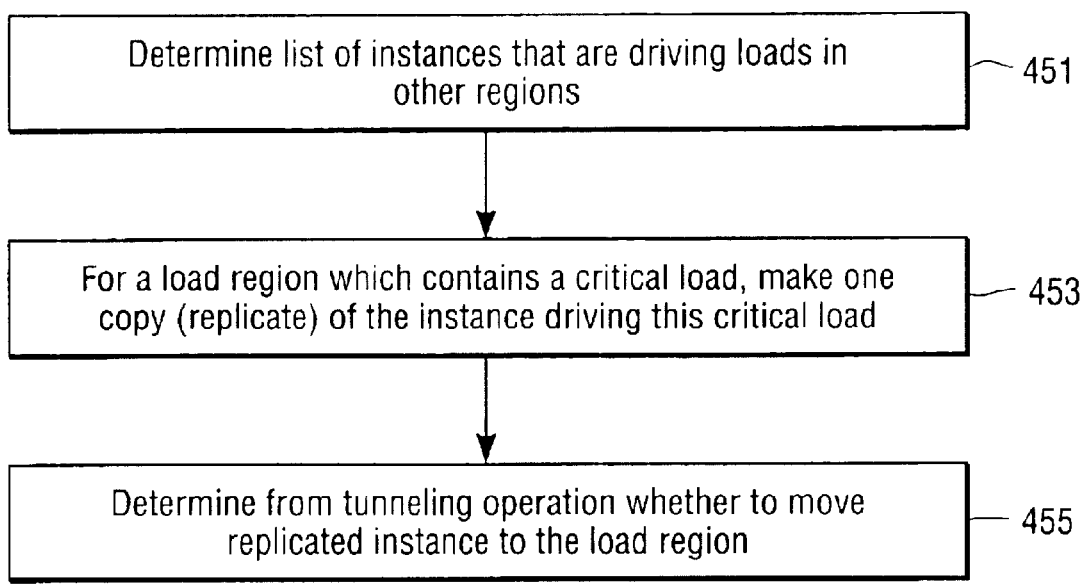
FIG. 11 is a flowchart illustrating one particular method of a certain type of reallocation which is described herein.

FIGS. 9, 10, and 11 will now be referred to in describing another method of reallocating logic in which logic within a region is replicated and in some cases moved to another region. FIG. 9 illustrates two floorplan regions. In the case of region 421, the user has assigned the multiplexer 423 and clocked register 424 to region 421. Region 422 is another region. The system has automatically assigned or the user has assigned certain logic as shown in region 422 to this region. In particular, logic 426 and clocked register 427 have been assigned to this region 422. Following the assignment of the logic to region 421 by the user, the system has replicated clocked register 424 to create another clocked register 425 which is a copy of clocked register 424. As can be seen from FIG. 9, the output of the instance 424 is connected to the input of another logic or instance 426 such that the instance, clocked register 424, is considered or referred to as the driver of the instance 426 which is referred to as the load of the driver which is the clocked register 424. FIG. 9 shows a situation in which an instance in a region that is driving instances assigned to other regions has been replicated. A replicated copy, also known as the replicant, will then drive loads in one of those other regions. This will reduce the wire length at the output of the copy, and also the copy can now be conveniently tunneled to the destination region to further reduce the output delay. This is further shown in FIG. 10 in which the copy, clocked register 425, has been moved to region 422. If an instance has several loads in different regions, it may be replicated several times (e.g. one copy per region) and each replicant may be tunneled to the region of its load. The benefit of such replication is typically improved design performance.

FIG. 11 shows one exemplary method for performing replication, such as the replication shown in FIGS. 9 and 10. In this method, operation 451 determines a list of instances that are driving loads in other regions. For a load region which contains a critical load, one copy is made of the instance which drives this critical load; see operation 453. Then in operation 455, a tunneling operation may be performed to determine whether to move the replicated instance to the load region. That is, the tunneling method described above, such as that shown in FIG. 8, may be employed to determine whether to move the replicated instance to the load region.

Figure 1:
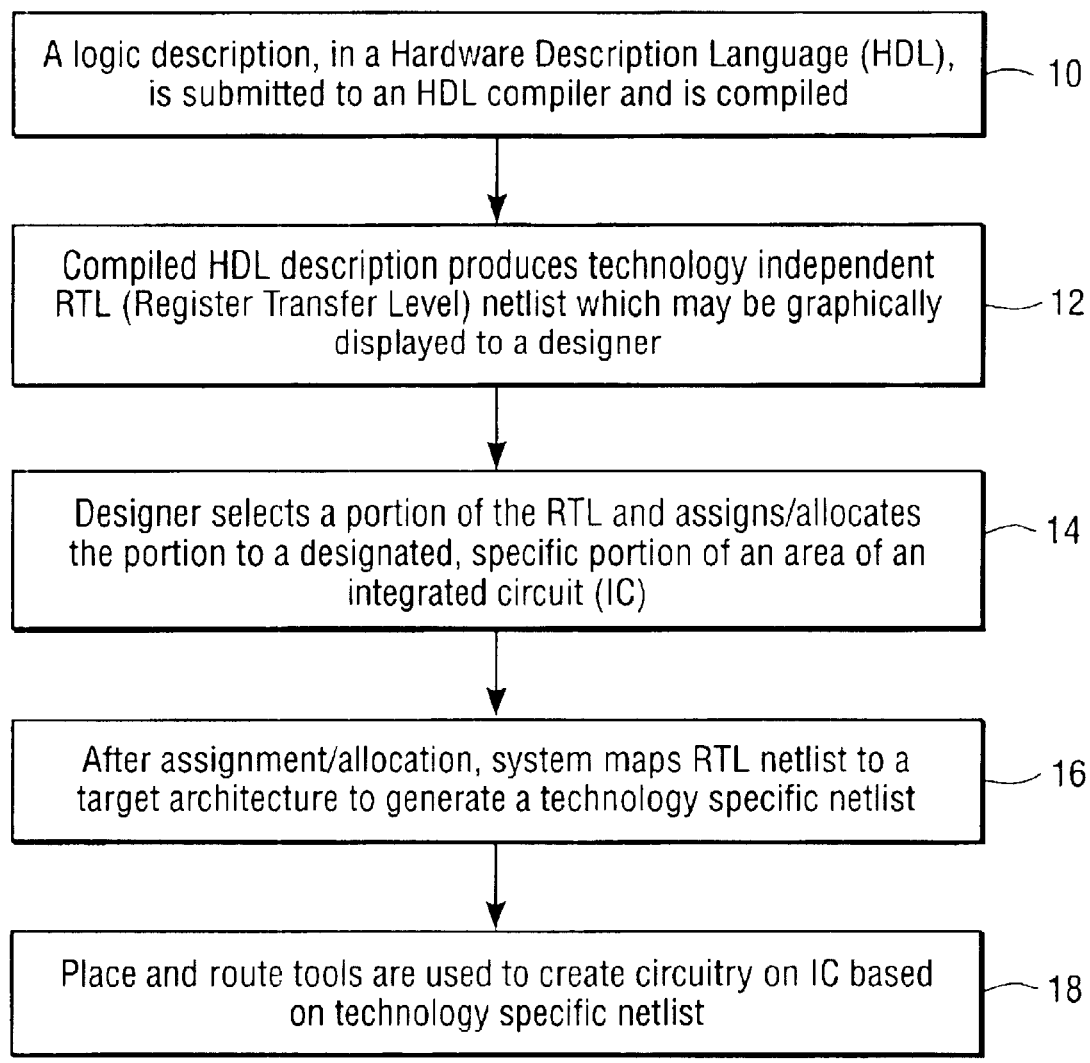
FIG. 1 shows a method in the prior art for designing integrated circuits.
Figure 12D:
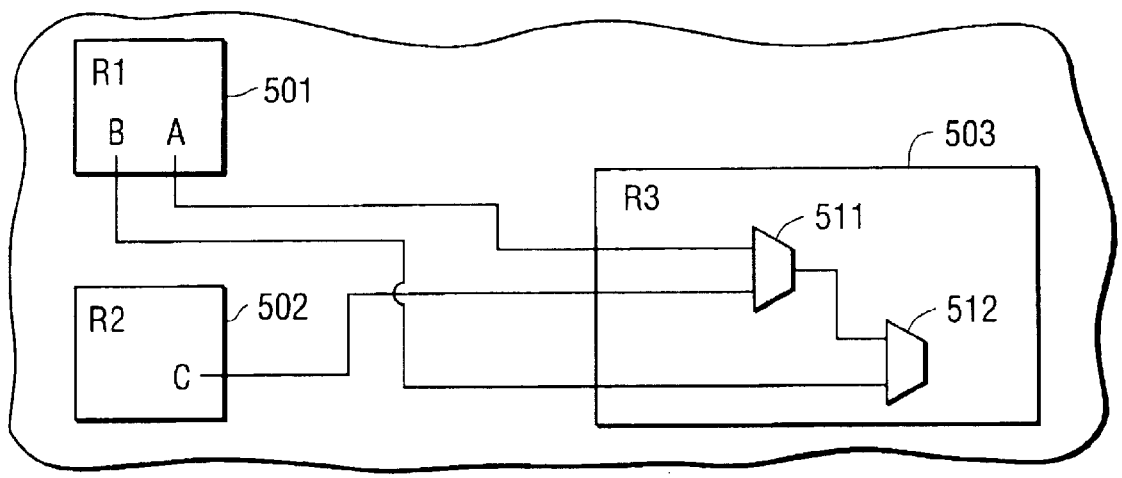
FIG. 12D shows the results of a decomposition of an RTL instance where the origin of the inputs is taken into account according to one type of reallocation described herein.
Figure 12D:
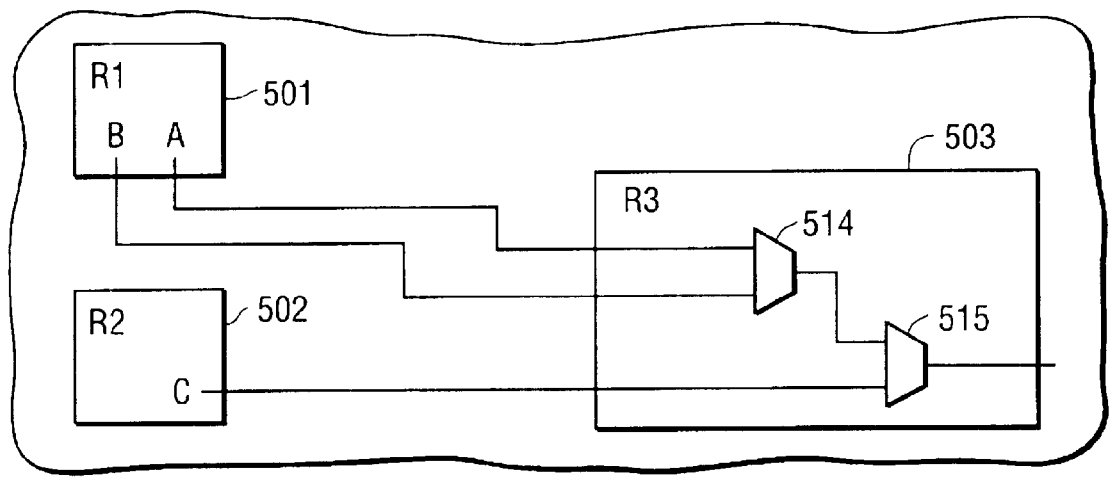
Figure 12E:
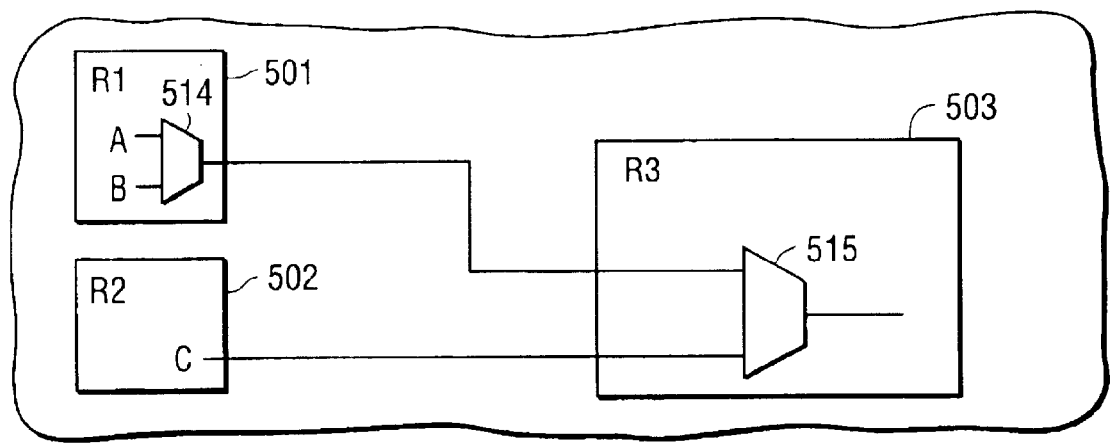
FIG. 12E shows the result of a further reallocation after a decomposition according to one method of reallocation which is described herein.

FIGS. 12A, 12B, 12C1, 12C2, 12D, 12E, and 12F will now be referred to in describing a reallocation method in which decomposition of logic instances, such as RTL instances, uses region information and optionally timing information in performing decomposition. As is well known, an RTL netlist contains large instances that need to be broken down into smaller instances, such that the smaller instances can eventually be translated into the primitive cells of the targeted part. This process is known as decomposition, and an example of such a process is shown in FIG. 12A, in which a three input multiplexer 481 is decomposed into two smaller multiplexers 482 and 483. In this case, the inputs A and B have been assigned to the inputs of the multiplexer 482, and input C, along with the output of multiplexer 482, has been assigned as the inputs to multiplexer 483. According to one decomposition method described herein, region information of the drivers of the instance being decomposed are utilized in the decomposition process. FIGS. 12B, 12C1, and 12C2 will now be referred to in showing how a decomposition occurs without the utilization of region information. As shown in FIG. 12B, the multiplexer 492 in floorplanned region 493, includes an A input which originates from region 491 which may be a floorplanned region created by the user. The origin of input A is not considered when decomposing multiplexer 492. This is further shown in FIGS. 12C1 and 12C2. In particular, region 503, which is a floorplan region containing multiplexer 505, receives three inputs having the slack values shown as 506, 507, and 508 from the three different inputs A, B, and C as shown in FIG. 12C1. Inputs A and B originate from region 501 and input C originates from region 502. In the past, the slack values 506, 507, and 508 would be used in the decomposition process such that inputs having the nearest slack values would be supplied to a decomposed element. This is shown in FIG. 12C2 in which the decomposed multiplexer 505 results in decomposed elements 511 and 512, where the multiplexer 511 receives inputs A and C from regions 501 and 502, rather than receiving inputs A and B from the same region 501. The decomposition shown in FIG. 12C2 typically results in longer propagation delays through longer wire lengths than can be achieved with the decomposition shown in FIGS. 12D and 12E. In particular, as shown in FIG. 12D, if the decomposition elements 514 and 515 are decomposed with knowledge of the regions from which the inputs originate, then the decomposed element 514 is driven by inputs A and B which originate from the same region 501, while input C originating from region 502, is supplied to the decomposed element 515. Further reallocating the logic, if desired or beneficial, may result in moving the multiplexer 514 into the region 501 as shown in FIG. 12E.

Figure 12F:
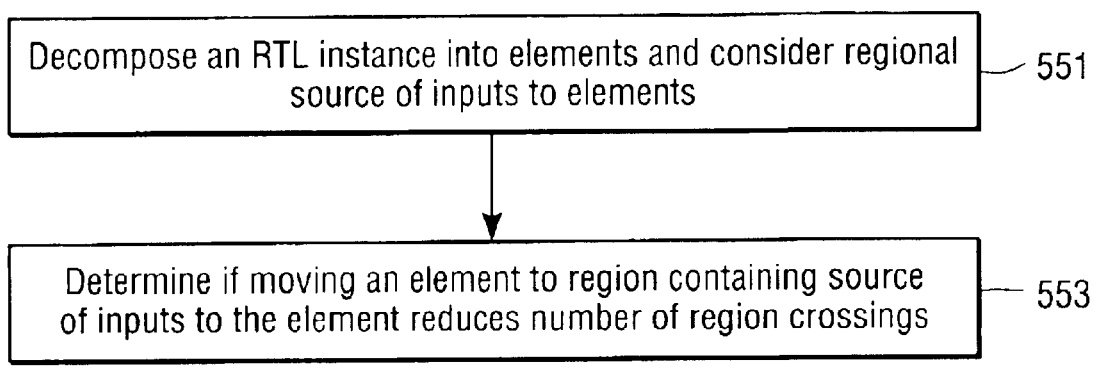
FIG. 12F is a flowchart illustrating a decomposition method which is an example of an automatic reallocation described herein.

FIG. 12F shows an exemplary method of decomposition. In this method, operation 551 decomposes an RTL instance into elements and considers the regional source of the inputs to these elements. In the case of FIG. 12D, decomposed element 514 uses inputs A and B from region 501 rather than the situation shown in FIG. 12C2 because the system has determined the regional source of the inputs to the elements and has assigned those inputs having common regions to the same element, creating the multiplexer 514 as shown in FIG. 12D. In operation 553, the system determines whether to move the element to a region containing the source of inputs to the element if the move improves the design by reducing region crossings, which may improve a timing parameter such as the slack at the input to the element or the slack at the output of the element.

Figure 13A:
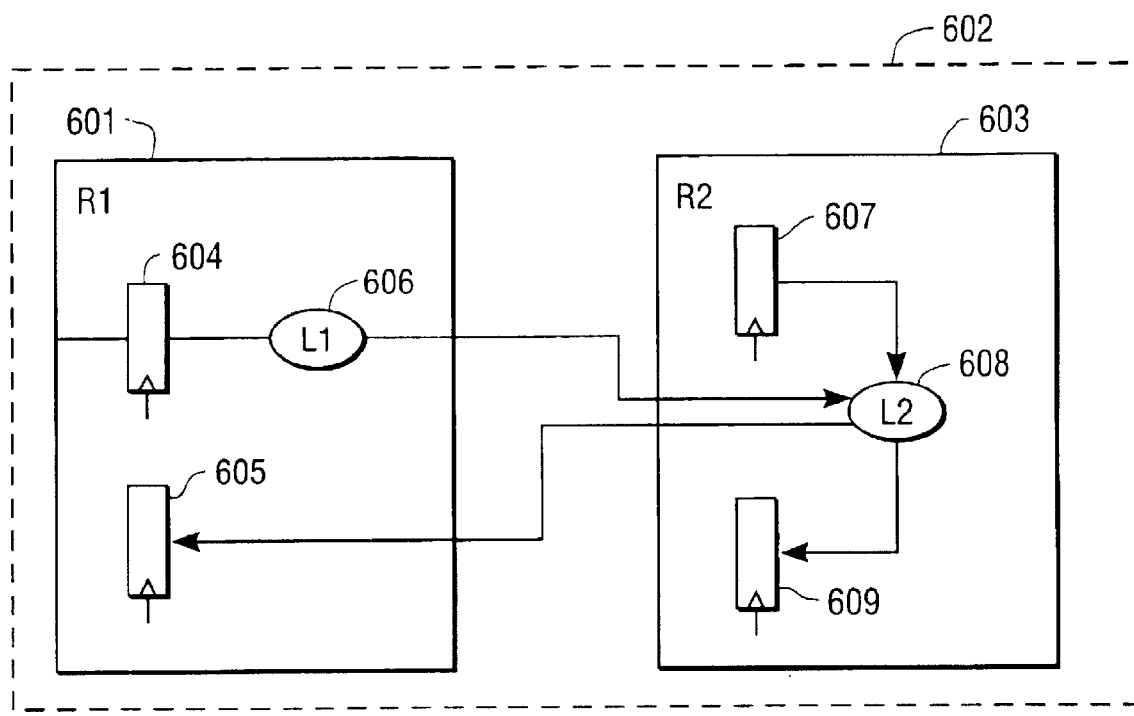
FIG. 13A is a graphical representation of logic on two regions of an integrated circuit where there are logic path region crossings across at least one region's boundary.
Figure 13B:
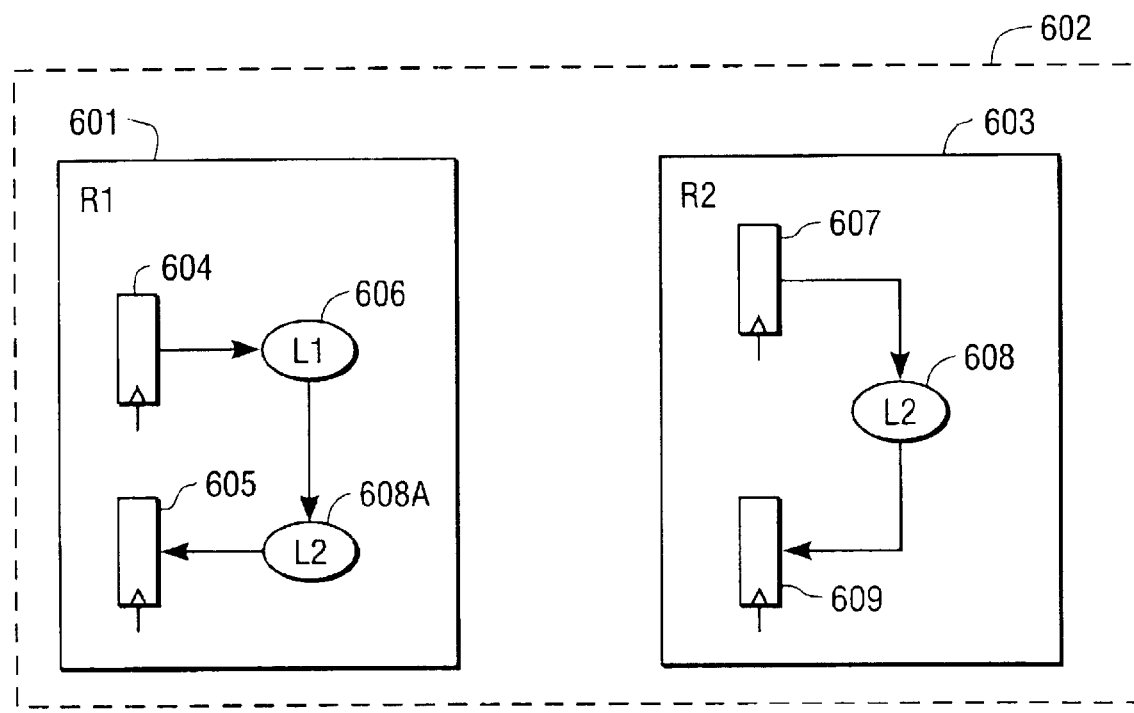
FIG. 13B shows the representation of logic within two regions after a reallocation according to one example of reallocation described herein.

FIGS. 13A, 13B, and 13C will now be referred to while describing a reallocation method in which region crossings are reduced. A register to register logic path may be contained in several regions. Each region crossing introduces a delay (based on the distance between the regions) in the path, thus reducing the overall performance (e.g. the maximum clock speed is reduced) of the design. An example of this is shown in FIG. 13A in which the IC 602 includes two floorplanned regions, regions 601 and 603. The user may have allocated clocked registers 604 and 605 along with logic 606 to the region 601, and may have similarly allocated logic 608 along with clocked register 607 and 609 to region 603. The register to register logic path from register 604 to register 605 crosses the boundary of region 601 twice. According to one method of the reallocation techniques described herein, these region crossings may be reduced by either moving or replicating logic as described above. For instance, as shown in FIG. 13B, logic L2 may be replicated to create a replicant logic 608A which may then be moved into region 601. Thus, as shown in FIG. 13B, the complete path is now contained in region 601, thus avoiding two region crossings. In certain instances, the start and end points of the path may be in different regions, and removing an intermediate region from the path can still be a significant advantage.

FIG. 13C shows an example of a method which may be used to reduce region crossings. FIGS. 13A and 13B represent an example of the beginning and the end of such a method. Operation 621 of FIG. 13C may be performed for each register to register path which starts in a first region and ends in a second region, where these regions could be the same. This operation determines all sequences of instances on the path that are contained in regions other than the first and the second region. The effect of a perspective move on the timing parameters (e.g. input and output slacks at clocked registers) is determined in operation 623. If the timing parameters are improved by the move, then the sequence is moved to either of the regions depending on which has better timing parameters after the perspective move, unless the sequence is driving loads in other regions, in which case the sequence is replicated and the copy is moved to the one region or to the other. In the case shown in FIGS. 13A and 13B, the input slack to register 605 would be improved by moving the logic 608 after creating the replicant of the logic. Since this logic is also driving loads in another region, in this case region 603, the logic L2 is replicated to create a replicant logic 608A which is then moved into region 601 as shown in FIG. 13B. It will be appreciated that logic that is connected to the side inputs of the sequence may also need to be moved to avoid creating a new critical path; side inputs are those instances which drive the sequence and that are not in the sequence and that are not in the critical path. It will also be appreciated that movement of logic, such as the logic 608 from region 603 into region 601, may adversely affect the slack parameters of registers 607 and 609, and particularly register 609. In this case, replication and moving the replicant prevents creating a worse slack parameter for register 609.

Figure 14:
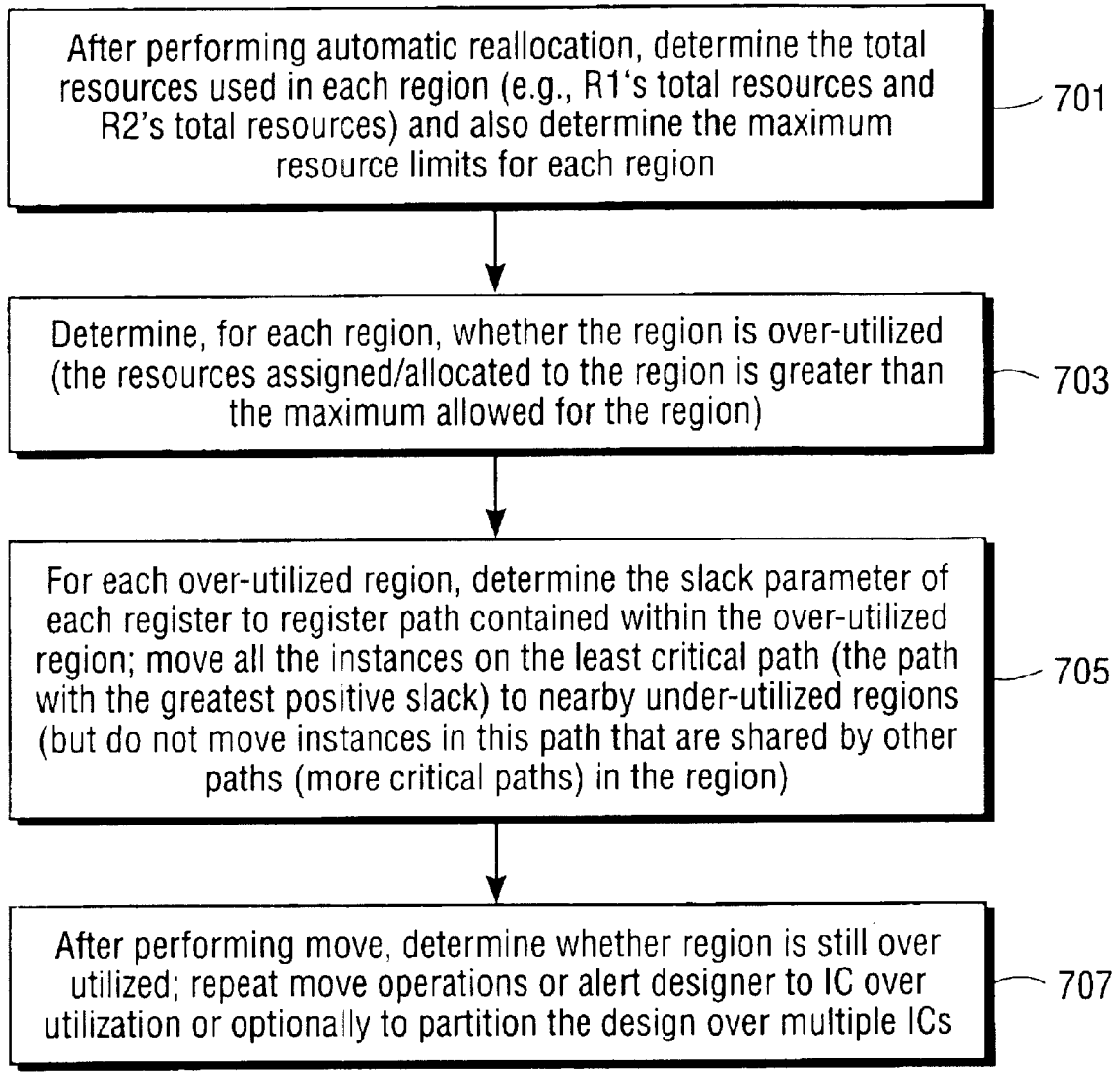
FIG. 14 is a flowchart showing another method which may be used as part of the reallocation methods described herein.

It will be appreciated that the automatic reallocation techniques described herein may create an "overload" in a region in that too much logic may be assigned to the region. This could be done by the user in the initial allocation, or it may occur during optimization, such as logic replication and logic tunneling or decomposition or the reduction of region crossings. An overutilized region results in an illegal output netlist that cannot be placed and routed by place and route tools. Thus, it may be desirable to detect when a region is overutilized and, in such case, to reduce its utilization to acceptable limits by moving non-critical logic from the region to nearby regions. FIG. 14 shows an exemplary method for performing this operation. Operation 701 begins typically after performing all of the automatic reallocations. In this operation, the total resources used in each region are determined, and also the maximum resource limits for each region are determined. Then in operation 703, for each region, it is determined whether the resources assigned/allocated to the region by the user and by the system after reallocation is greater than the maximum allowed resources for the particular region. For those regions which are not overutilized, the method ends at operation 703. For those regions which are overutilized, operation 705 attempts to move logic out of overutilized regions into nearby underutilized regions. This will typically involve moving all instances on the least critical path (the path with the greatest positive slack) to a nearby underutilized region, taking care not to move too much logic to an underutilized region because one does not want to turn the underutilized region into an overutilized region. After performing the move, operation 707 determines whether the region is still overutilized. If it is, further move operations are performed by repeating operation 705, and this may continue until the overutilized region is no longer overutilized. Again, the movement of instances from overutilized regions should not turn an underutilized into an overutilized region. After each move operation in 705, the operation 707 is performed to determine whether the region is still overutilized. If it becomes impossible to reduce the overutilization, the system may alert the user to the overutilization or may optionally ask the user if the user prefers to partition the design over multiple integrated circuits. It will be appreciated that, at least in one embodiment of the present invention, the entire chip area is considered a region, and if operation 703 determines that this entire chip area region is overutilized, then normally operation 707 would follow immediately from operation 703, wherein the user would be alerted to the overutilization of the integrated circuit and asked whether it was desired to partition the design over multiple integrated circuits.

Figure 15:
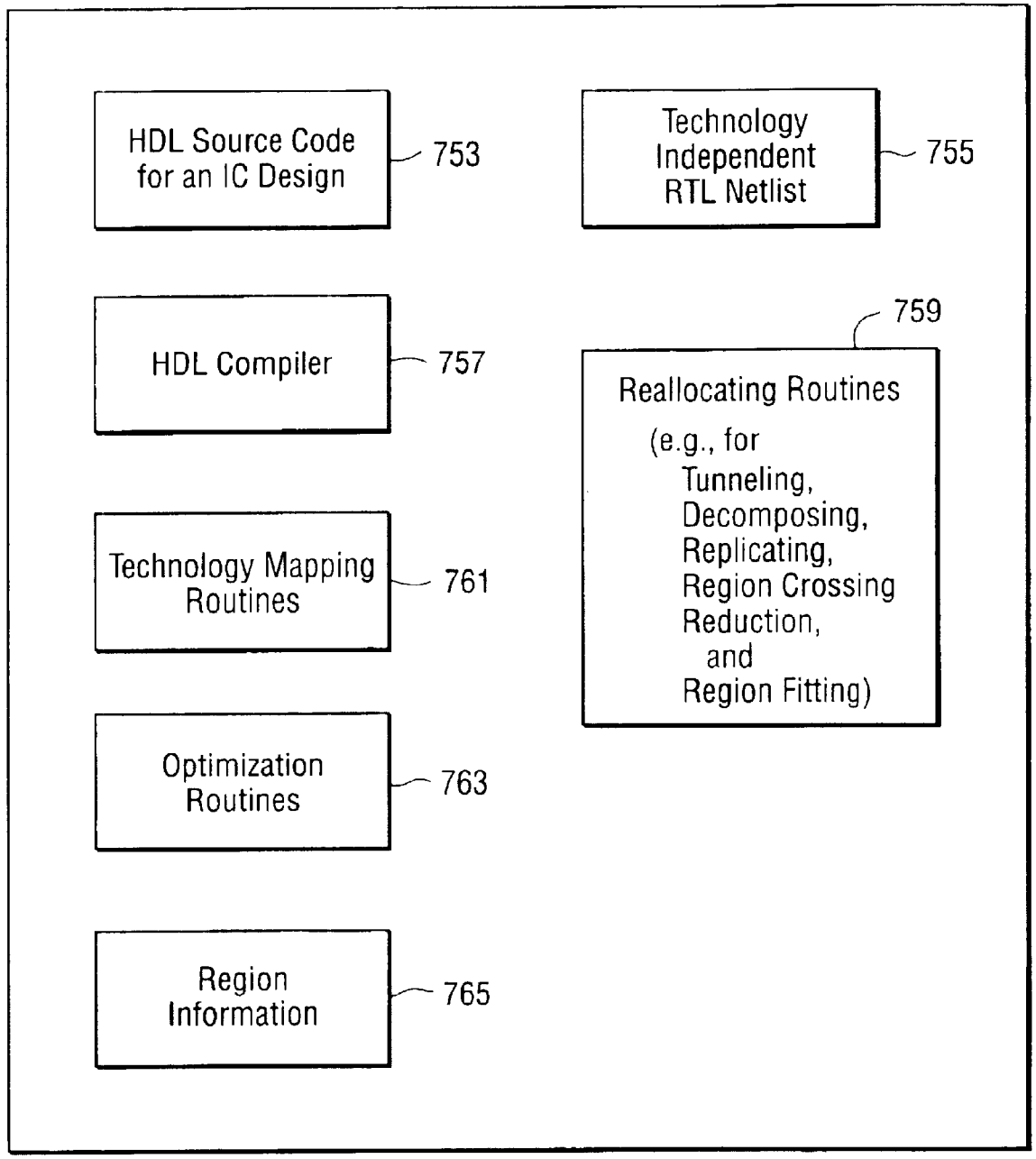
FIG. 15 shows an example of a machine readable media which may be used to perform any one of or all of the various types of reallocation which are described herein.

One embodiment of the present invention may be a circuit design and synthesis computer aided design software that is implemented as a computer program which is stored in a machine readable media, such as a CD ROM, or a magnetic hard disk, or an optical disk, or a volatile random access memory (e.g. DRAM) or various other alternative storage devices. FIG. 15 shows an example of such a media 751 which may have both volatile portions and non-volatile portions. In the example shown in FIG. 15, a source code HDL file 753 is stored in the media 751 and, after compilation of the source code, a technology independent RTL netlist 755 is stored in the memory, which is typically non-volatile memory such as a DRAM, although not necessarily non-volatile in certain circumstances. In a typical implementation, the media 751 will also include programming instructions necessary to perform the various processes of the embodiments described herein, including the compilation of the HDL source code, the technology mapping and optimization, as well as the reallocating routines described above. Thus, for example, the media 751 may include an HDL compiler 757 which operates on HDL source code such as the source code stored in memory 753 in order to produce the technology independent RTL list also stored in memory as the netlist 755. Technology mapping routines, such as conventional software mapping routines, may be stored as routines 761 in the media 751. These technology mapping routines 761 are used to perform mapping operations from the technology independent netlist to a technology specific netlist as described above. Optimization routines 763 may perform conventional optimization, such as the recognition and extraction of counters. Region information 765 is typically information concerning the size and resources associated with floorplanned regions and optionally the tags relating to the instances that have been assigned to the various regions. The reallocating routines 759 are stored in the media, and these routines perform the various reallocation techniques, such as the tunneling, decomposing, replicating, reducing region crossing, and region fitting as described above.

The operations of the various methods of the present invention may be implemented by a processing unit in a digital processing system which executes sequences of computer program instructions which are stored in a memory which may be considered to be a machine readable storage media. The memory may be volatile random access memory, read-only memory, a persistent storage memory, such as a mass storage device, or any combination of these devices. Execution of the sequences of instructions causes the processing unit to perform operations according to the techniques described herein. The instructions will be loaded into memory of the computer from a storage device or from one or more other digital processing systems, such as a server system over a network connection. The instructions may be stored concurrently in several storage devices (e.g. volatile DRAM and a hard disk). Consequently, the execution of these instructions may be performed directly by the processing unit. In other instances, the instructions may not be performed directly or they may not be directly executable by the processing unit. Under these circumstances, the executions may be executed by causing the processor to execute and interpreter that interprets the instructions, or by causing the processor to execute instructions which convert the received instructions to instructions that can be directly executed by the processor. In other embodiments, hardwired circuitry may be used in place of or in combination with software instructions to implement the present invention. Thus, the present invention in not limited to any specific combination of hardware circuitry and software nor to any particular source for the instructions executed by the computer or digital processing system.

Although the present invention has been described with reference to specific exemplary embodiments, it will be evident that various modifications and changes may be made to these embodiments without departing from the broader spirit and scope of the invention as set forth in the following claims. Accordingly, the specification and drawings are to be regarded in an illustrative sense rather than a restrictive sense.

What is claimed is:

1. A method for designing an integrated circuit (IC), said method comprising:
    compiling a hardware description language (HDL) code to produce a representation of logic;
    allocating a portion of said representation of logic to a first physical portion of an area of said IC;
    reallocating automatically, according to machine determined parameters, said portion such that a modified portion of said representation is allocated to said first physical portion.
2. A method as in claim 1 wherein said representation of logic is a technology independent register transfer level (RTL) representation.
3. A method as in claim 2 wherein said allocating is performed in response to a request from a human involved in said method and wherein said first physical portion is defined by a physical boundary on said IC.
4. A method as in claim 2 further comprising:
    mapping said technology independent RTL representation to a selected technology architecture.
5. A method as in claim 4 further comprising:
    performing a place and route operation after said mapping to implement said IC in said selected technology architecture.
6. A method as in claim 2 wherein said IC comprises one of a programmable logic device or an Application Specific IC (ASIC).
7. A method as in claim 2 wherein said reallocating comprises moving a selected logic in said portion from said first physical portion to a second physical portion of said area of said IC.
8. A method as in claim 7 wherein said selected logic is moved based on at least one machine determined parameter which comprises a timing parameter.
9. A method as in claim 8 wherein said allocating is performed in response to a request from a human involved in said method and wherein said method further comprises:
    mapping said technology independent RTL representation to a selected technology architecture; and
    performing a place and route operation after said mapping to implement said IC in said selected technology architecture.
10. A method as in claim 2 wherein said reallocating comprises replicating a selected logic to create a replicated selected logic in said portion and determining a timing parameter related to said replicated selected logic and conditionally moving said replicated selected logic from said first physical portion to a second physical portion of said area of said IC.
11. A method as in claim 10 wherein said conditionally moving is conditioned upon said timing parameter.
12. A method as in claim 11 wherein said replicated selected logic has a region tag associated therewith which specifies whether said replicated selected logic is part of said first physical portion or said second physical portion and wherein said region tag specifies said first physical portion before conditionally moving said replicated selected logic.
13. A method as in claim 11 wherein said allocating is performed in response to a request from a human involved in said method and wherein said method further comprises:
    mapping said technology independent RTL representation to a selected technology architecture;
    performing a place and route operation after said mapping to implement said IC in said selected technology architecture.
14. A method as in claim 2 further comprising:
    determining, after said reallocating, whether said modified portion can be implemented in said first physical portion.
15. A method as in claim 14 wherein if said modified portion cannot be implemented in said first physical portion, a portion of said modified portion is reallocated to another physical portion of said area of said IC.
16. A method as in claim 2 wherein said reallocating comprises decomposing an RTL instance into decomposed elements which are capable of being allocated to a physical region of said area of said IC based upon a predetermined location of inputs to said decomposed elements, wherein said RTL instance is part of said technology independent RTL representation.
17. A method as in claim 16 wherein some of said decomposed elements are moved from said first physical portion to a second physical portion of said area of said IC based upon said predetermined location of inputs which originate from said second physical portion.
18. A method as in claim 17 wherein said allocating is performed in response to a request from a human involved in said method and wherein said method further comprises:
    mapping said technology independent RTL representation to a selected technology architecture;
    performing a place and route operation after said mapping to implement said IC in said selected technology architecture.
19. A method as in claim 18 wherein said decomposing is performed prior to said mapping.
20. A method as in claim 2 wherein said first physical portion comprises a physical boundary and wherein said reallocating comprises determining whether a logic path of said portion crosses said physical boundary and determining at least one of (a) whether to move at least a portion of logic in said logic path outside of said first physical portion or (b) replicate at least said portion of said logic in said logic path, wherein said reallocating reduces a number of logic path crossings of said physical boundary.

21. A computer implemented system for designing an integrated circuit (IC), said system comprising:
  means for compiling a hardware description language (HDL) code to produce a representation of logic;
  means for allocating a portion of said representation of logic to a first physical portion of an area of said IC;
  means for reallocating automatically, according to machine determined parameters, said portion such that a modified portion of said representation is allocated to said first physical portion.

22. A system as in claim 21 wherein said representation of logic is a technology independent register transfer level (RTL) representation.

23. A system as in claim 22 wherein said allocating is performed in response to a request from a human involved with said system and wherein said first physical portion is defined by a physical boundary on said IC.

24. A system as in claim 22 further comprising:
  means for mapping said technology independent RTL representation to a selected technology architecture.

25. A system as in claim 24 further comprising:
  means for performing a place and route operation after said mapping to implement said IC in said selected technology architecture.

26. A system as in claim 22 wherein said IC comprises one of a programmable logic device or an Application Specific IC (ASIC).

27. A system as in claim 22 wherein said means for reallocating comprises a means for moving a selected logic in said portion from said first physical portion to a second physical portion of said area of said IC.

28. A system as in claim 27 wherein said selected logic is moved based on at least one machine determined parameter which comprises a timing parameter.

29. A system as in claim 28 wherein said allocating is performed in response to a request from a human involved with said system and wherein said system further comprises:
  means for mapping said technology independent RTL representation to a selected technology architecture; and
  means for performing a place and route operation after said mapping to implement said IC in said selected technology architecture.

30. A system as in claim 22 wherein said means for reallocating comprises a means for replicating a selected logic to create a replicated selected logic in said portion and determining a timing parameter related to said replicated selected logic and conditionally moving said replicated selected logic from said first physical portion to a second physical portion of said area of said IC.

31. A system as in claim 30 wherein said conditionally moving is conditioned upon said timing parameter.

32. A system as in claim 31 wherein said replicated selected logic has a region tag associated therewith which specifies whether said replicated selected logic is part of said first physical portion or said second physical portion and wherein said region tag specifies said first physical portion before conditionally moving said replicated selected logic.

33. A system as in claim 31 wherein said allocating is performed in response to a request from a human involved with said system and wherein said system further comprises:
  means for mapping said technology independent RTL representation to a selected technology architecture;
  means for performing a place and route operation after said mapping to implement said IC in said selected technology architecture.

34. A system as in claim 22 further comprising:
  means for determining, after said reallocating, whether said modified portion can be implemented in said first physical portion.

35. A system as in claim 34 wherein if said modified portion cannot be implemented in said first physical portion, a portion of said modified portion; is reallocated to another physical portion of said area of said IC.

36. A system as in claim 22 wherein said means for reallocating comprises means for decomposing an RTL instance into decomposed elements which are capable of being allocated to a physical region of said area of said IC based upon a predetermined location of inputs to said decomposed elements, wherein said RTL instance is part of said technology independent RTL representation.

37. A system as in claim 36 wherein some of said decomposed elements are moved from said first physical portion to a second physical portion of said area of said IC based upon said predetermined location of inputs which originate from said second physical portion.

38. A system as in claim 37 wherein said allocating is performed in response to a request from a human involved with said system and wherein said system further comprises:
  means for mapping said technology independent RTL representation to a selected technology architecture;
  means for performing a place and route operation after said mapping to implement said IC in said selected technology architecture.

39. A system as in claim 38 wherein said decomposing is performed prior to said mapping.

40. A system as in claim 22 wherein said first physical portion comprises a physical boundary and wherein said means for reallocating comprises means for determining whether a logic path of said portion crosses said physical boundary and determining at least one of (a) whether to move at least a portion of logic in said logic path outside of said first physical portion or (b) replicate at least said portion of said logic in said logic path, wherein said reallocating reduces a number of logic path crossings of said physical boundary.

41. A machine readable medium containing executable computer program instructions which cause a system to perform a method for designing an integrated circuit (IC), said method comprising:
  compiling a hardware description language (HDL) code to produce a representation of logic;
  allocating a portion of said representation of logic to a first physical portion of an area of said IC;
  reallocating automatically, according to machine determined parameters, said portion such that a modified portion of said representation is allocated to said first physical portion.

42. A machine readable medium as in claim 41 wherein said representation of logic is a technology independent register transfer level (RTL) representation.

43. A machine readable medium as in claim 42 wherein said allocating is performed in response to a request from a human involved in said method and wherein said first physical portion is defined by a physical boundary on said IC.

44. A machine readable medium as in claim 42, said method further comprising:
  mapping said technology independent RTL representation to a selected technology architecture.

45. A machine readable medium as in claim 44, said method further comprising:

performing a place and route operation after said mapping to implement said IC in said selected technology architecture.

46. A machine readable medium as in claim 42 wherein said IC comprises one of a programmable logic device or an Application Specific IC (ASIC).

47. A machine readable medium as in claim 42 wherein said reallocating comprises moving a selected logic in said portion from said first physical portion to a second physical portion of said area of said IC.

48. A machine readable medium as in claim 47 wherein said selected logic is moved based on at least one machine determined parameter which comprises a timing parameter.

49. A machine readable medium as in claim 48 wherein said allocating is performed in response to a request from a human involved in said method and wherein said method further comprises:
    mapping said technology independent RTL representation to a selected technology architecture; and
    performing a place and route operation after said mapping to implement said IC in said selected technology architecture.

50. A machine readable medium as in claim 42 wherein said reallocating comprises replicating a selected logic to create a replicated selected logic in said portion and determining a timing parameter related to said replicated selected logic and conditionally moving said replicated selected logic from said first physical portion to a second physical portion of said area of said IC.

51. A machine readable medium as in claim 50 wherein said conditionally moving is conditioned upon said timing parameter.

52. A machine readable medium as in claim 51 wherein said replicated selected logic has a region tag associated therewith which specifies whether said replicated selected logic is part of said first physical portion or said second physical portion and wherein said region tag specifies said first physical portion before conditionally moving said replicated selected logic.

53. A machine readable medium as in claim 51 wherein said allocating is performed in response to a request from a human involved in said method and wherein said method further comprises:
    mapping said technology independent RTL representation to a selected technology architecture;
    performing a place and route operation after said mapping to implement said IC in said selected technology architecture.

54. A machine readable medium as in claim 42, said method further comprising:
    determining, after said reallocating, whether said modified portion can be implemented in said first physical portion.

55. A machine readable medium as in claim 54 wherein if said modified portion cannot be implemented in said first physical portion, a portion of said modified portion is reallocated to another physical portion of said area of said IC.

56. A machine readable medium as in claim 42 wherein said reallocating comprises decomposing an RTL instance into decomposed elements which are capable of being allocated to a physical region of said area of said IC based upon a predetermined location of inputs to said decomposed elements, wherein said RTL instance is part of said technology independent RTL representation.

57. A machine readable medium as in claim 56 wherein some of said decomposed elements are moved from said first physical portion to a second physical portion of said area of said IC based upon said predetermined location of inputs which originate from said second physical portion.

58. A machine readable medium as in claim 57 wherein said allocating is performed in response to a request from a human involved in said method and wherein said method further comprises:
    mapping said technology independent RTL representation to a selected technology architecture;
    performing a place and route operation after said mapping to implement said IC in said selected technology architecture.

59. A machine readable medium as in claim 58 wherein said decomposing is performed prior to said mapping.

60. A machine readable medium as in claim 42 wherein said first physical portion comprises a physical boundary and wherein said reallocating comprises determining whether a logic path of said portion crosses said physical boundary and determining at least one of (a) whether to move at least a portion of logic in said logic path outside of said first physical portion or (b) replicate at least said portion of said logic in said logic path, wherein said reallocating reduces a number of logic path crossings of said physical boundary.

61. A machine readable medium containing executable computer program instructions which cause a system to perform a method for designing an integrated circuit (IC), said method comprising:
    allocating a portion of a representation of logic to a first physical portion of an area of said IC;
    reallocating automatically, according to machine determined parameters, said portion such that a modified portion of said representation is allocated to said first physical portion.

62. A machine readable medium as in claim 61 wherein said representation of logic is a technology independent register transfer level (RTL) representation.

63. A machine readable medium as in claim 62 wherein said allocating is performed in response to a request from a human involved in said method and wherein said first physical portion is defined by a physical boundary on said IC.

64. A machine readable medium as in claim 62, said method further comprising:
    mapping said technology independent RTL representation to a selected technology architecture.

65. A machine readable medium as in claim 62 wherein said IC comprises one of a programmable logic device or an Application Specific IC (ASIC).

66. A machine readable medium as in claim 64, said method further comprising:
    performing a place and route operation after said mapping to implement said IC in said selected technology architecture.

67. A machine readable medium as in claim 62 wherein said reallocating comprises moving a selected logic in said portion from said first physical portion to a second physical portion of said area of said IC.

68. A machine readable medium as in claim 67 wherein said selected logic is moved based on at least one machine determined parameter which comprises a timing parameter.

69. A machine readable medium as in claim 68 wherein said allocating is performed in response to a request from a human involved in said method and wherein said method further comprises:
    mapping said technology independent RTL representation to a selected technology architecture; and performing a place and route operation after said mapping to implement said IC in said selected technology architecture.

70. A machine readable medium as in claim 62 wherein said reallocating comprises replicating a selected logic to create a replicated selected logic in said portion and determining a timing parameter related to said replicated selected logic and conditionally moving said replicated selected logic from said first physical portion to a second physical portion of said area of said IC.

71. A machine readable medium as in claim 70 wherein said conditionally moving is conditioned upon said timing parameter.

72. A machine readable medium as in claim 71 wherein said replicated selected logic has a region tag associated therewith which specifies whether said replicated selected logic is part of said first physical portion or said second physical portion and wherein said region tag specifies said first physical portion before conditionally moving said replicated selected logic.

73. A machine readable medium as in claim 71 wherein said allocating is performed in response to a request from a human involved in said method and wherein said method further comprises:
   mapping said technology independent RTL representation to a selected technology architecture;
   performing a place and route operation after said mapping to implement said IC in said selected technology architecture.

74. A machine readable medium as in claim 62, said method further comprising:
   determining, after said reallocating, whether said modified portion can be implemented in said first physical portion.

75. A machine readable medium as in claim 74 wherein if said modified portion cannot be implemented in said first physical portion, a portion of said modified portion is reallocated to another physical portion of said area of said IC.

76. A machine readable medium as in claim 62 wherein said reallocating comprises decomposing an RTL instance into decomposed elements which are capable of being allocated to a physical region of said area of said IC based upon a predetermined location of inputs to said decomposed elements, wherein said RTL instance is part of said technology independent RTL representation.

77. A machine readable medium as in claim 76 wherein some of said decomposed elements are moved from said first physical portion to a second physical portion of said area of said IC based upon said predetermined location of inputs which originate from said second physical portion.

78. A machine readable medium as in claim 77 wherein said allocating is performed in response to a request from a human involved in said method and wherein said method further comprises:
   mapping said technology independent RTL representation to a selected technology architecture;
   performing a place and route operation after said mapping to implement said IC in said selected technology architecture.

79. A machine readable medium as in claim 78 wherein said decomposing is performed prior to said mapping.

80. A machine readable medium as in claim 62 wherein said first physical portion comprises a physical boundary and wherein said reallocating comprises determining whether a logic path of said portion crosses said physical boundary and determining at least one of (a) whether to move at least a portion of logic in said logic path outside of said first physical portion or (b) replicate at least said portion of said logic in said logic path, wherein said reallocating reduces a number of logic path crossings of said physical boundary.

* * * * *